(12) United States Patent
Choi et al.

(10) Patent No.: US 7,799,645 B2
(45) Date of Patent: Sep. 21, 2010

(54) SEMICONDUCTOR DEVICE AND METHOD OF MANUFACTURING THE SAME

(75) Inventors: Jung-Dal Choi, Seoul (KR); Young-Woo Park, Seoul (KR); Jin-Taek Park, Suwon-si (KR); Chung-Il Hyun, Seoul (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 34 days.

(21) Appl. No.: 12/232,148

(22) Filed: Sep. 11, 2008

(65) Prior Publication Data

US 2009/0072298 A1 Mar. 19, 2009

(30) Foreign Application Priority Data

Sep. 17, 2007 (KR) .................. 10-2007-094278

(51) Int. Cl.
 *H01L 21/8236* (2006.01)
(52) U.S. Cl. .................. 438/278; 438/275; 438/276; 438/287; 438/303; 438/305; 257/326; 257/328; 257/E21.679; 257/E27.103
(58) Field of Classification Search .................. 438/275, 438/276, 278, 287, 290, 303, 305, FOR. 405; 257/326, 328, E21.679, E27.103
See application file for complete search history.

(56) References Cited

U.S. PATENT DOCUMENTS 6,016,217 A * 1/2000 Dotzel et al. ................. 359/292

| | | | |
|---|---|---|---|
| 6,858,906 B2 | 2/2005 | Lee et al. | |
| 7,253,467 B2 | 8/2007 | Lee et al. | |
| 2005/0087778 A1* | 4/2005 | Gamo et al. ................. | 257/288 |
| 2005/0239248 A1 | 10/2005 | Lee | |
| 2006/0180851 A1 | 8/2006 | Lee et al. | |
| 2007/0293029 A1* | 12/2007 | Ogawa et al. ................ | 438/585 |

FOREIGN PATENT DOCUMENTS

| JP | 2005-150687 | 6/2005 |
|---|---|---|
| KR | 10-2003-0090368 | 11/2003 |
| KR | 10-2006-0007159 | 1/2006 |

\* cited by examiner

*Primary Examiner*—N Drew Richards
*Assistant Examiner*—Joannie A Garcia
(74) *Attorney, Agent, or Firm*—Harness, Dickey & Pierce, P.L.C.

(57) ABSTRACT

An embodiment of a semiconductor device includes a substrate including a cell region and a peripheral region; a cell gate pattern on the cell region; and a peripheral gate pattern on the peripheral region, wherein a first cell insulation layer, a second cell insulation layer, and a third cell insulation layer may be between the substrate and the cell gate pattern, a first peripheral insulation layer, a second peripheral insulation layer, and a third peripheral insulation layer may be between the substrate and the peripheral gate pattern, and the second cell insulation layer and the third cell insulation layer include the same material as the respective second peripheral insulation layer and third peripheral insulation layer.

21 Claims, 18 Drawing Sheets

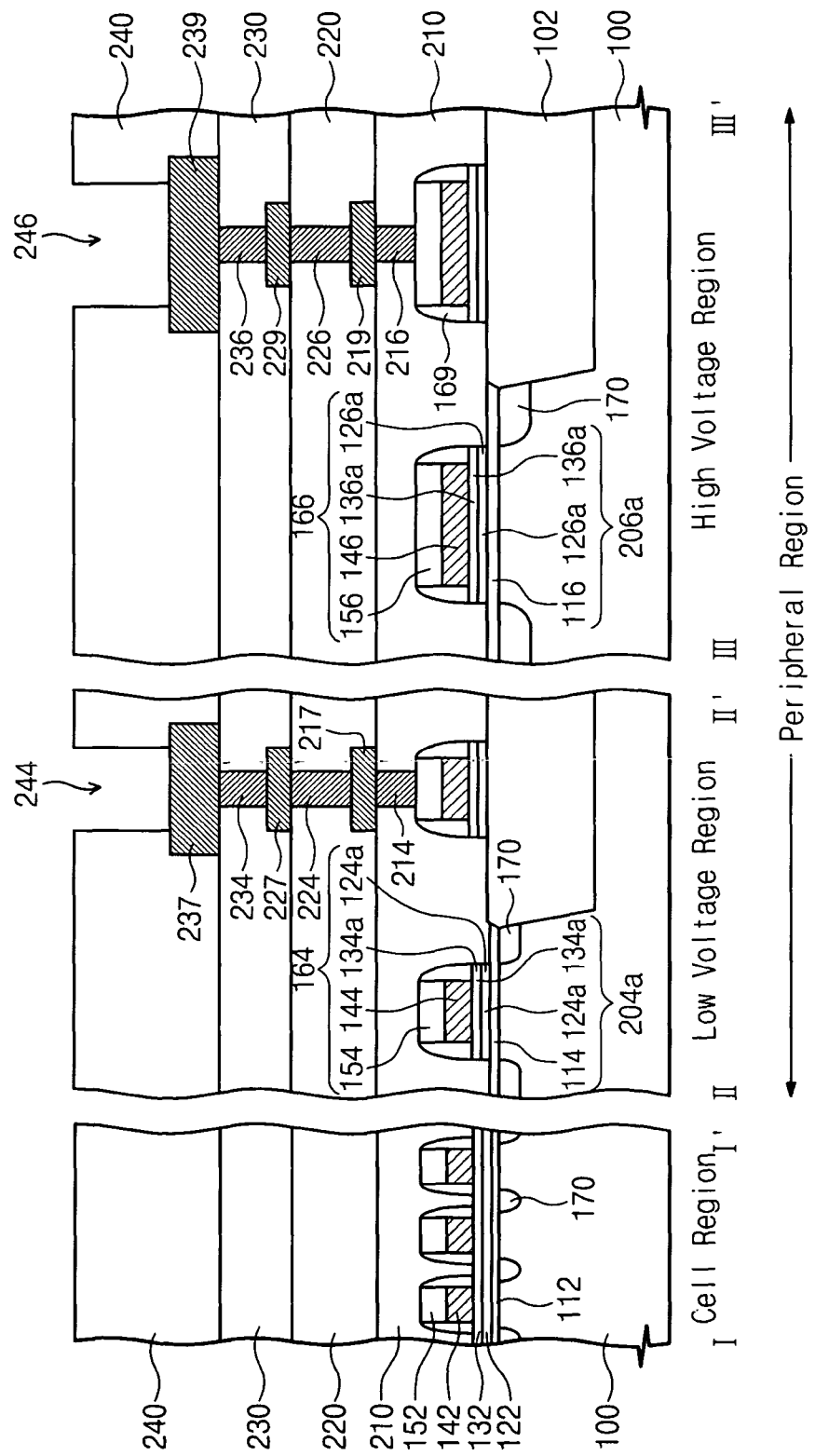

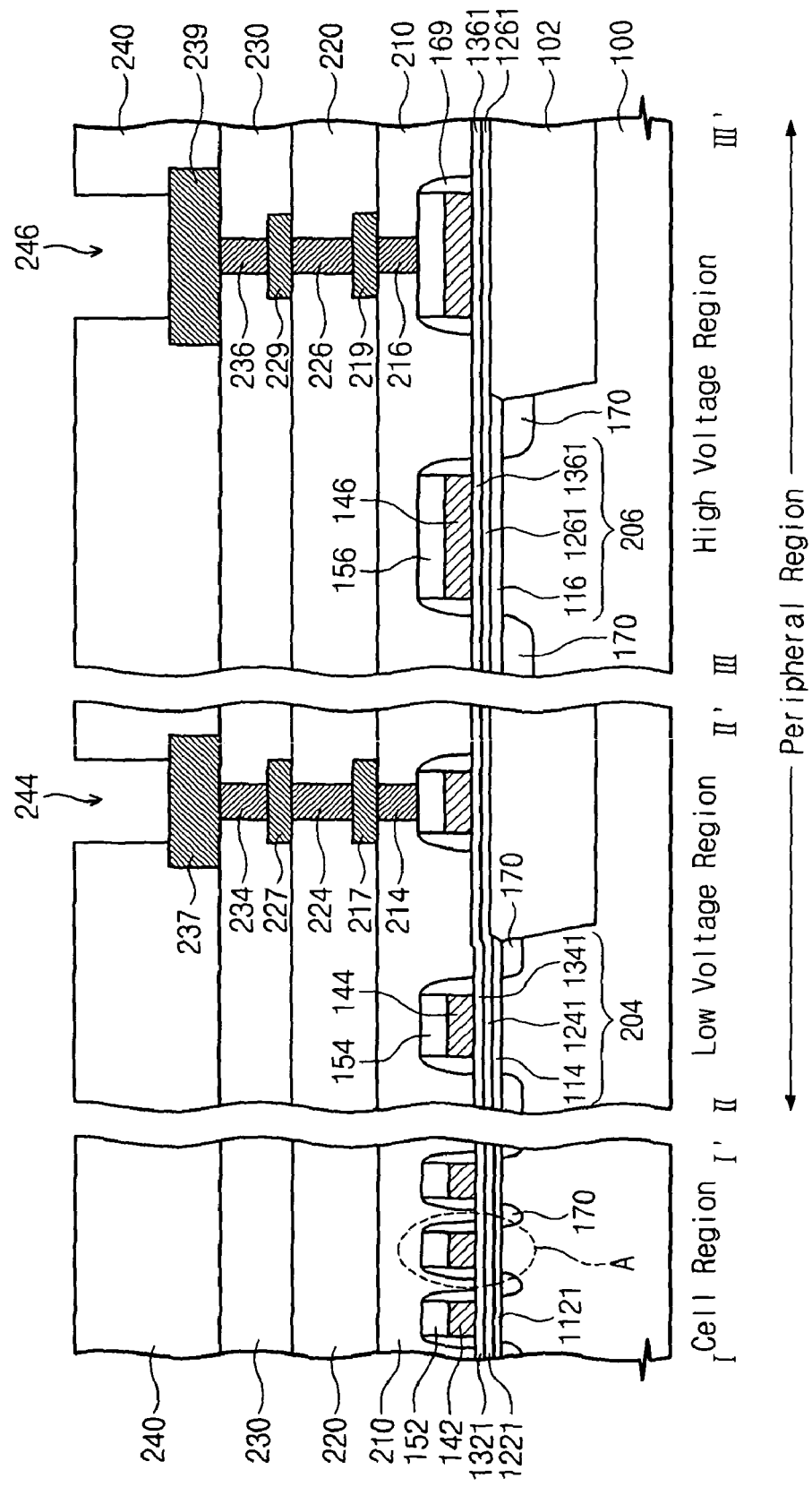

SEMICONDUCTOR DEVICE AND METHOD OF MANUFACTURING THE SAME

PRIORITY STATEMENT

This U.S. non-provisional patent application claims priority under 35 U.S.C. §119 to Korean Patent Application No. 10-2007-0094278, filed on Sep. 17, 2007, in the Korean Intellectual Property Office (KIPO), the entire contents of which are incorporated herein by reference.

BACKGROUND

1. Field

Example embodiments relate to a semiconductor device manufactured through simplified processes, and a method of manufacturing the same.

2. Description of the Related Art

A non-volatile memory device is a semiconductor device retaining its data even when there is no power supply. The non-volatile memory device includes a plurality of cell transistors and a plurality of driving transistors for driving the cell transistors.

The non-volatile memory device may be classified into a floating gate type device and a floating trap type device according to a structure of a memory cell. A memory cell of the floating trap type device may include a gate insulation layer, a charge storage layer, a blocking insulation layer, and a gate electrode. A memory cell of the floating trap type device may be programmed through a method of storing charges in a trap of a charge storage layer. Accordingly, even if a gate insulation layer of a floating trap type device is damaged, only a portion of charges stored in a charge storage layer may be lost. For example, a gate insulation layer of the floating trap type device is formed relatively thin, and a memory cell of the floating trap type device operates at a lower operating voltage. For example, the floating trap type device has less power consumption compared to that of the floating gate type device, and also, an operating speed of the floating trap type device may be improved compared to that of the floating gate type device.

A non-volatile memory device includes a peripheral circuit for driving a memory cell. The peripheral circuit includes a high voltage transistor to which a higher voltage is applied. Additionally, the peripheral circuit includes a low voltage transistor to which a lower voltage is applied. Because a higher voltage is applied to a gate of the high voltage transistor, a gate insulation layer of the high voltage transistor may be formed with a thick thickness. On the contrary, a gate insulation layer of the low voltage transistor may be formed with a thin thickness. There may be different types of transistors in one non-volatile memory device in order to perform different functions. Therefore, manufacturing processes of a non-volatile memory device may be complex.

SUMMARY

Example embodiments provide a semiconductor device having improved reliability through simpler manufacturing processes and a method of manufacturing the same.

Example embodiments provide semiconductor devices including: a substrate including a cell region and a peripheral region; a cell gate pattern on the cell region; and a peripheral gate pattern on the peripheral region, wherein a first insulation layer, a second cell insulation layer, and a third cell insulation layer may be between the substrate and the cell gate pattern, a first peripheral insulation layer, a second peripheral insulation layer, and a third peripheral insulation layer may be between the substrate and the peripheral gate pattern, and the second cell insulation layer and the third cell insulation layer include the same material as the second peripheral insulation layer and third peripheral insulation layer.

In example embodiments, the peripheral region includes a high voltage region and a low voltage region, and the first peripheral insulation layer includes a first high voltage insulation layer on the high voltage region and a first low voltage insulation layer on the low voltage region, wherein the first high voltage insulation layer may be thicker than the first low voltage insulation layer, and the first low voltage insulation layer may be thicker than the first cell insulation layer.

In example embodiments, the second cell insulation layer includes silicon nitride or nanocrystal. In example embodiments, the second cell insulation layer may have the same thickness as the second peripheral insulation layer, and the third cell insulation layer may have the same thickness as the third peripheral insulation layer.

In example embodiments, the third cell insulation layer includes at least one of silicon oxide ($Si_xO_y$), aluminum oxide ($Al_xO_y$), tantalum oxide ($Ta_xO_y$), hafnium oxide ($HfO_2$), hafnium aluminum oxide (HfAlO), and hafnium silicon oxide (HfSiO). In example embodiments, the cell gate pattern and the peripheral gate pattern include the same conductive material. In example embodiments, the conductive material includes a metal.

In example embodiments, the semiconductor devices further include a cell mask pattern and a peripheral mask pattern on the cell gate pattern and the peripheral gate pattern, a spacer on sidewalls of the cell gate pattern and the peripheral gate pattern, and an impurity region in the substrate below the sidewalls of the cell gate pattern and the peripheral gate pattern.

In example embodiments, the semiconductor devices further include: a contact on the peripheral gate pattern to be electrically connected to the peripheral gate pattern; a bonding pad on the contact to be electrically connected to the contact; and a capping insulation layer exposing the bonding pad.

In example embodiments, the second cell insulation layer, the third cell insulation layer, the second peripheral insulation layer, and the third peripheral insulation layer extend on the semiconductor substrate. In example embodiments, the second cell insulation layer and the third cell insulation layer extend on the semiconductor substrate, and the second peripheral insulation layer and the third peripheral insulation layer may be aligned to the same sidewall as the peripheral gate pattern.

In example embodiments, the second cell insulation layer and the third cell insulation layer may be aligned to the same sidewall as the cell gate pattern, and the second peripheral insulation layer and the third peripheral insulation layer may be aligned to the same sidewall of the peripheral gate pattern.

In example embodiments, at least one of the first cell insulation layer, the second cell insulation layer, and the third cell insulation layer includes a plurality of layers.

In example embodiments, methods of manufacturing a semiconductor device include: providing a substrate including a cell region and a peripheral region; forming a first peripheral insulation layer on the peripheral region; forming a first cell insulation layer on the cell region; simultaneously forming a second cell insulation layer on the first cell insulation layer and a second peripheral insulation layer on the first peripheral insulation layer; simultaneously forming a third cell insulation layer on the second cell insulation layer and a third peripheral insulation layer on the second peripheral insulation layer; and respectively forming a cell gate pattern and a peripheral gate pattern on the third cell insulation layer and the third peripheral insulation layer.

In example embodiments, the peripheral region includes a high voltage region and a low voltage region, and the first peripheral insulation layer includes a first high voltage insulation layer on the high voltage region and a first low voltage insulation layer on the low voltage region, wherein the first high voltage insulation layer may be thicker than the first low voltage insulation layer, and the first low voltage insulation layer may be thicker than the first cell insulation layer.

In example embodiments, the second cell insulation layer includes silicon nitride or nanocrystal. In example embodiments, the third cell insulation layer includes at least one of silicon oxide ($Si_xO_y$), aluminum oxide ($Al_xO_y$), tantalum oxide ($Ta_xO_y$), hafnium oxide ($HfO_2$), hafnium aluminum oxide (HfAlO), and hafnium silicon oxide (HfSiO).

In example embodiments, forming the cell gate pattern and the peripheral gate pattern includes: forming a conductive layer on the third cell insulation layer and the third peripheral insulation layer; forming an etching mask on the conductive layer; and etching the conductive layer to expose the third cell insulation layer and the third peripheral insulation layer of the cell region and the peripheral region by using the etching mask. In example embodiments, the methods further include: removing the etching mask; forming a cell mask to cover the cell region; and etching the third peripheral insulation layer and the second peripheral insulation layer to expose the first peripheral insulation layer of the peripheral region by using the cell mask.

In example embodiments, the methods further include etching the third cell insulation layer, the third peripheral insulation layer, the second cell insulation layer, and the second peripheral insulation layer to expose the first cell insulation layer and the first peripheral insulation layer by using the etching mask. In example embodiments, the cell gate pattern and the peripheral gate pattern include the same conductive material. In example embodiments, the conductive material includes a metal. In example embodiments, the methods further include: forming a mask layer on a top surface of the gate patterns; forming a spacer on sidewalls of the gate patterns; and forming an impurity region in the substrate below the sidewalls of the gate patterns.

In example embodiments, the methods further include: forming a contact connected to the peripheral gate pattern electrically; forming a bonding pad connected to the contact electrically; forming a capping insulation layer on a result having the bonding pad; and performing a plasma etching process on the capping insulation layer to expose a top surface of the bonding pad, wherein power of the plasma etching process ranges from about 1000 W to about 1500 W. In example embodiments, at least one of the first cell insulation layer, the second cell insulation layer, and the third cell insulation layer includes a plurality of layers.

BRIEF DESCRIPTION OF THE FIGURES

Example embodiments will be more clearly understood from the following detailed description taken in conjunction with the accompanying drawings. FIGS. 1-18 represent non-limiting, example embodiments as described herein.

FIG. 1 is a plan view of a semiconductor device according to example embodiments;

FIGS. 2 through 5A are cross sectional views taken along lines I-I', II-II', and III-III' of FIG. 1;

FIG. 6 is a circuit diagram of a semiconductor device according to example embodiments;

FIGS. 7 through 15 are cross sectional views taken along lines I-I', II-II', and III-III' of FIG. 1;

FIG. 16 is a view illustrating a modular memory device with a semiconductor device according to example embodiments;

FIG. 17 is a block diagram illustrating a memory system with a semiconductor device according to example embodiments; and FIG. 18 is a block diagram illustrating an electron device with a semiconductor device according to example embodiments.

Figure 1:
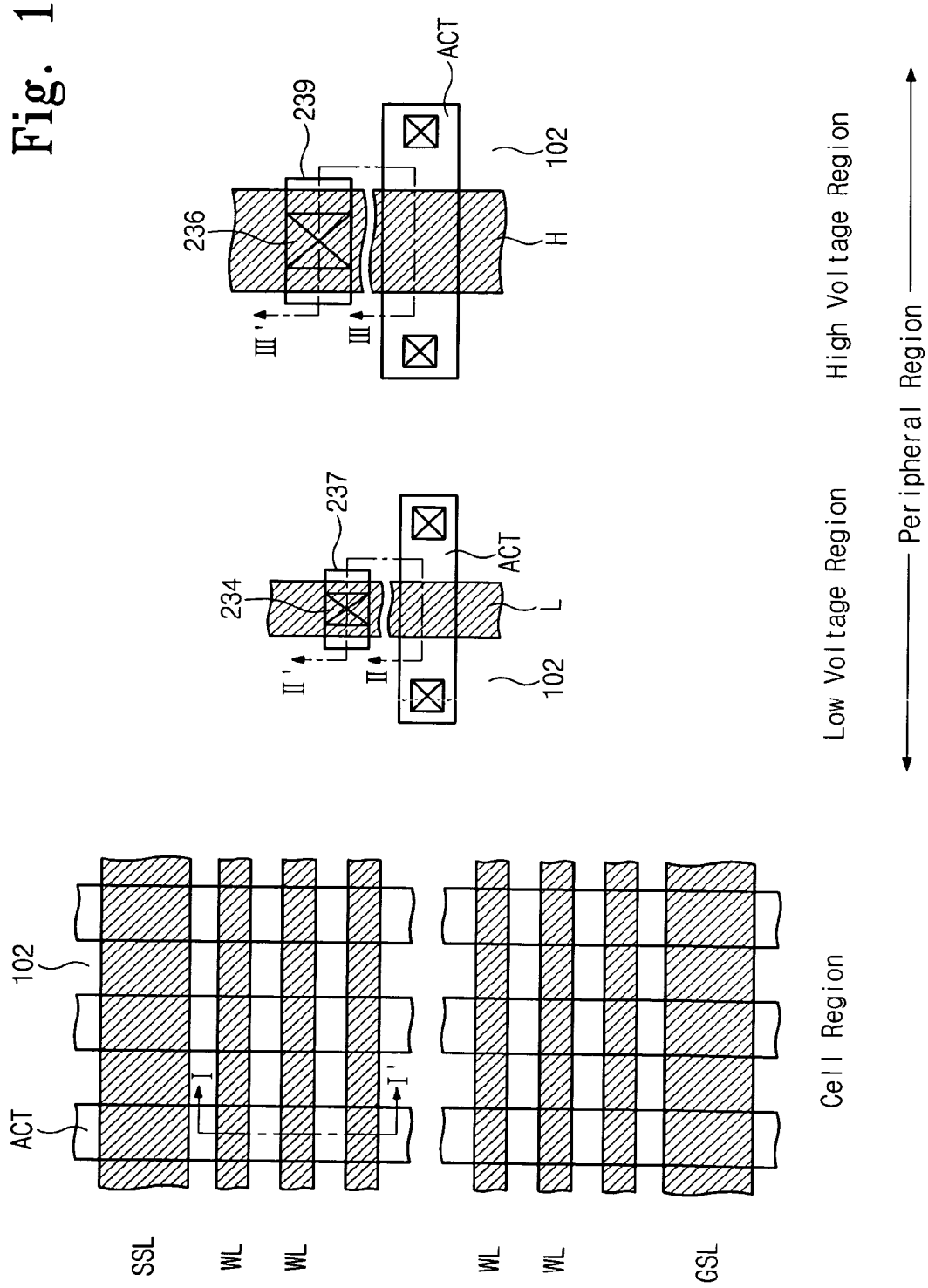

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will be described more fully hereinafter with reference to the accompanying drawings, in which example embodiments are shown. Example embodiments may, however, be embodied in different forms and should not be construed as limited to example embodiments set forth herein. Rather, example embodiments are provided so that this disclosure will be thorough and complete, and will fully convey the scope of example embodiments to those skilled in the art. In the drawings, the thickness of layers and regions are exaggerated for clarity. In addition, when a layer is described to be formed on another layer or on a substrate, this means that the layer may be formed on the other layer or on the substrate, or a third layer may be interposed between the layer and the other layer or the substrate. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
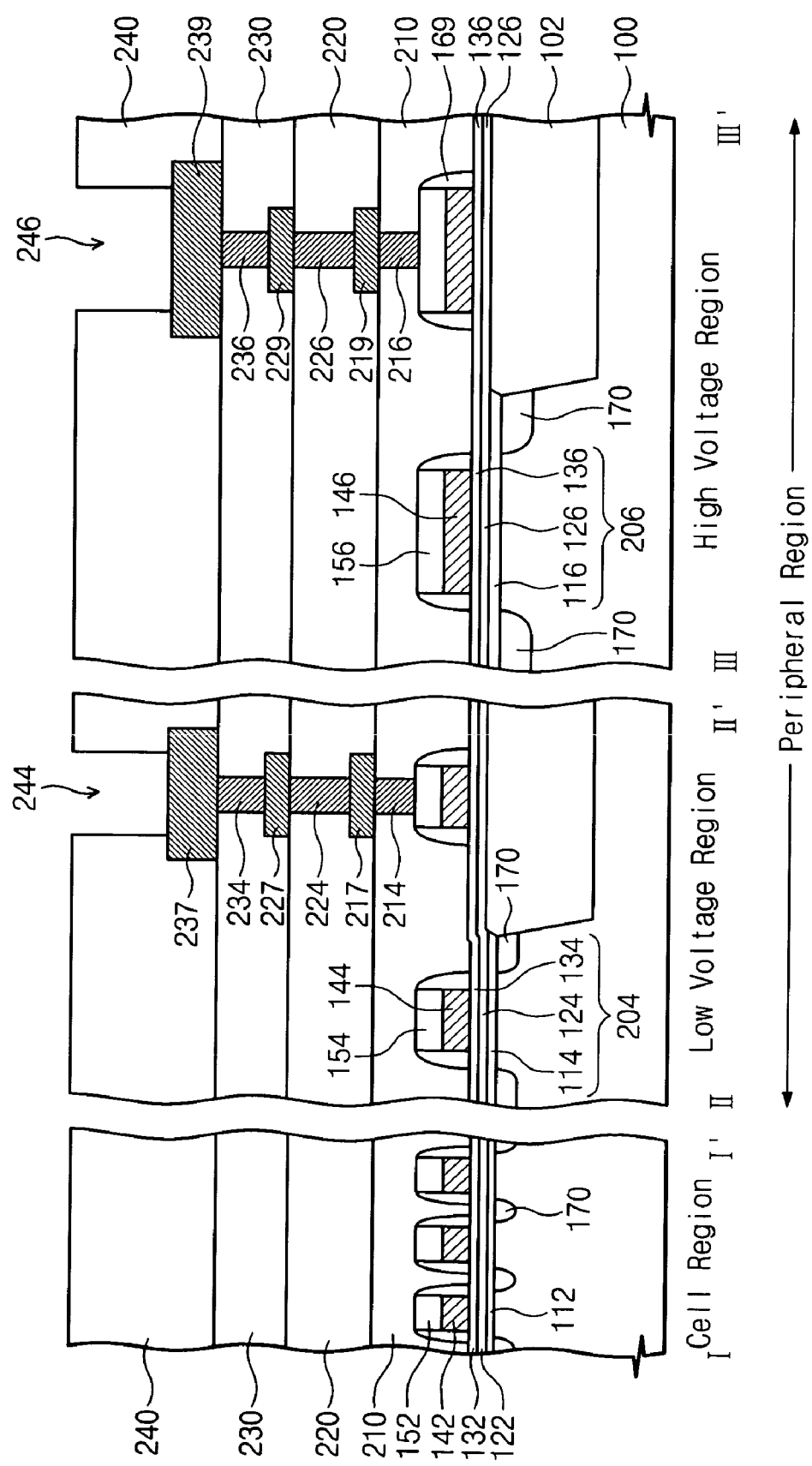

Referring to FIGS. 1 through 5B, a semiconductor device according to example embodiments will be described. Referring to FIGS. 1 and 2, a semiconductor substrate 100 includes a cell region and a peripheral region. The peripheral region includes a low voltage region and a high voltage region. In the cell region, an active region ACT defined by a device isolation region 102 may extend in a first direction. A plurality of word lines WL may extend in a second direction that crosses the first direction. A series of word lines WL may extend between a string selection line SSL and a ground selection line GSL parallel to the word lines WL. A common source line CSL may extend parallel to the ground selection line GSL in an opposite region of the ground selection line GSL where the word lines WL extend.

In the low voltage region of the peripheral region, a low voltage gate line L may extend to cross the active region defined by the device isolation region 102. In the high voltage region, a high voltage gate line H may extend to cross the active region. The word lines WL include a cell gate pattern 142, the low voltage gate line L includes a low voltage gate pattern 144, and the high voltage gate line H includes a high voltage gate pattern 146. The gate patterns 142, 144, 146 may include the same metal material, for example, at least one of tantalum nitride (TaN), tantalum (Ta), tungsten (W), tungsten nitride (WN), titanium (Ti), titanium nitride (TiN), and titanium aluminum nitride (TiAlN).

A first cell insulation layer 112, a second cell insulation layer 122, and a third cell insulation layer 132 may be sequentially stacked between the cell gate pattern 142 and the semiconductor substrate 100. A first low voltage insulation layer 114, a second low voltage insulation layer 124, and a third low voltage insulation layer 134 may be sequentially stacked between the low voltage gate pattern 144 and the semiconductor substrate 100. A first high voltage insulation layer 116, a second high voltage insulation layer 126, and a third high voltage insulation layer 136 may be sequentially stacked between the high voltage gate pattern 146 and the semiconductor substrate 100. The first cell insulation layer 112 may be a gate insulation layer, the second cell insulation layer 122 may be a charge storage layer, and the third cell insulation layer 132 may be a blocking layer.

The first low voltage insulation layer 114, the second low voltage insulation layer 124, and the third low voltage insulation layer 134 may constitute a low voltage insulation layer 204. The first high voltage insulation layer 116, the second high voltage insulation layer 126, and the third high voltage insulation layer 136 may constitute a high voltage gate insulation layer 206. The cell insulation layers 112, 122, 132, the low voltage insulation layers 114, 124, 134, and the high voltage insulation layers 116, 126, 136 may extend on the semiconductor substrate 100. The first high voltage insulation layer 116 and the first low voltage insulation layer 114 may be a first peripheral insulation layer. The second high voltage insulation layer 126 and the second low voltage insulation layer 124 may be a second peripheral insulation layer. The third high voltage insulation layer 136 and the third low insulation layer 134 may be a third peripheral insulation layer.

The first cell insulation layer 112, the first low voltage insulation layer 114, and the first high voltage insulation layer 116 may include the same material, for example, an oxide. To endure a high voltage, the first high voltage insulation layer 116 may be thicker than the first low voltage insulation layer 114. The first low voltage insulation layer 114 may be thicker than the first cell insulation layer 112.

The second cell insulation layer 122 and the second peripheral insulation layers 124, 126 may be a single layer including the same material. For example, the second cell insulation layer 122 and the second peripheral insulation layers 124, 126 may include silicon nitride or nanocrystal. The third cell insulation layer 132 and the third peripheral insulation layers 134, 136 may be a single layer including the same material. The third cell insulation layer 132 and the third peripheral insulation layers 134 and 136 may include a high-k dielectric material, for example, at least one of silicon oxide ($Si_xO_y$), aluminum oxide ($Al_xO_y$), tantalum oxide ($Ta_xO_y$), hafnium oxide ($HfO_2$), hafnium aluminum oxide (HfAlO), and hafnium silicon oxide (HfSiO).

A first mask layer 152 may be arranged on the cell gate pattern 142, a second mask layer 154 may be arranged on the low voltage gate pattern 144, and a third mask layer 156 may be arranged on the high voltage gate pattern 146. The mask layers 152, 154, 156 may include the same material, for example, an oxide. A spacer 169 may be further provided on each side of the gate patterns 142, 144, 146 and the mask layers 152, 154, 156. For example, the spacer 169 may include a middle temperature oxide (MTO) layer. An impurity region 170 may be disposed in the semiconductor substrate 100 exposed by the gate patterns 142, 144, 146. A first interlayer insulation layer 210, a second interlayer insulation layer 220, a third interlayer insulation layer 230, and a passivation layer 240 may be sequentially stacked on the resultant structure including the gate patterns 142, 144, 146. The interlayer insulation layers 210, 220, and 230 may include a silicon layer. The passivation layer 240 may include at least one of a silicon oxide layer, a silicon nitride layer, and a polyimide layer.

A first contact 214 and a second contact 216 contacting the low voltage gate pattern 144 and the high voltage gate pattern 146, respectively, through the second mask layer 154 and the third mask layer 156 may be disposed in the first interlayer insulation layer 210. Although not illustrated in the drawings, contacts (electrically connected to the impurity region 170) may be further formed in the first interlayer insulation layer 210. A first pad 217 and a second pad 219 may be respectively disposed on the first contact 214 and the second contact 216 in the second interlayer insulation layer 220. A third contact 224 and a fourth contact 226 contacting the first pad 217 and the second pad 219, respectively, may be disposed in the second interlayer insulation layer 220. A third pad 227 and a fourth pad 229 may be formed on the third contact 224 and the fourth contact 226, respectively, in the third interlayer insulation layer 230.

Additionally, a fifth contact 234 and a sixth contact 236 contacting the third pad 227 and the fourth pad 229, respectively, may be formed in the third interlayer insulation layer 230. Although not illustrated in the drawings, an interconnection (not shown), e.g., a bit line, may be formed in the third interlayer insulation layer 230. A first bonding pad 237 and a second bonding pad 239 may be disposed on the fifth contact 234 and the sixth contact 236 in the passivation layer 240. The bonding pads 237 and 239 may be relatively thicker than other pads. The passivation layer 240 may include a first pad opening 244 and a second pad opening 246 exposing the bonding pads 237, 239, respectively. External interconnections (not shown) connected to the bonding pads 237 and 239, respectively, may be further disposed. The above-mentioned contacts and pads may include a conductive material, and the conductive material may include polysilicon with impurities, tungsten, titanium or/and copper.

Figure 3:
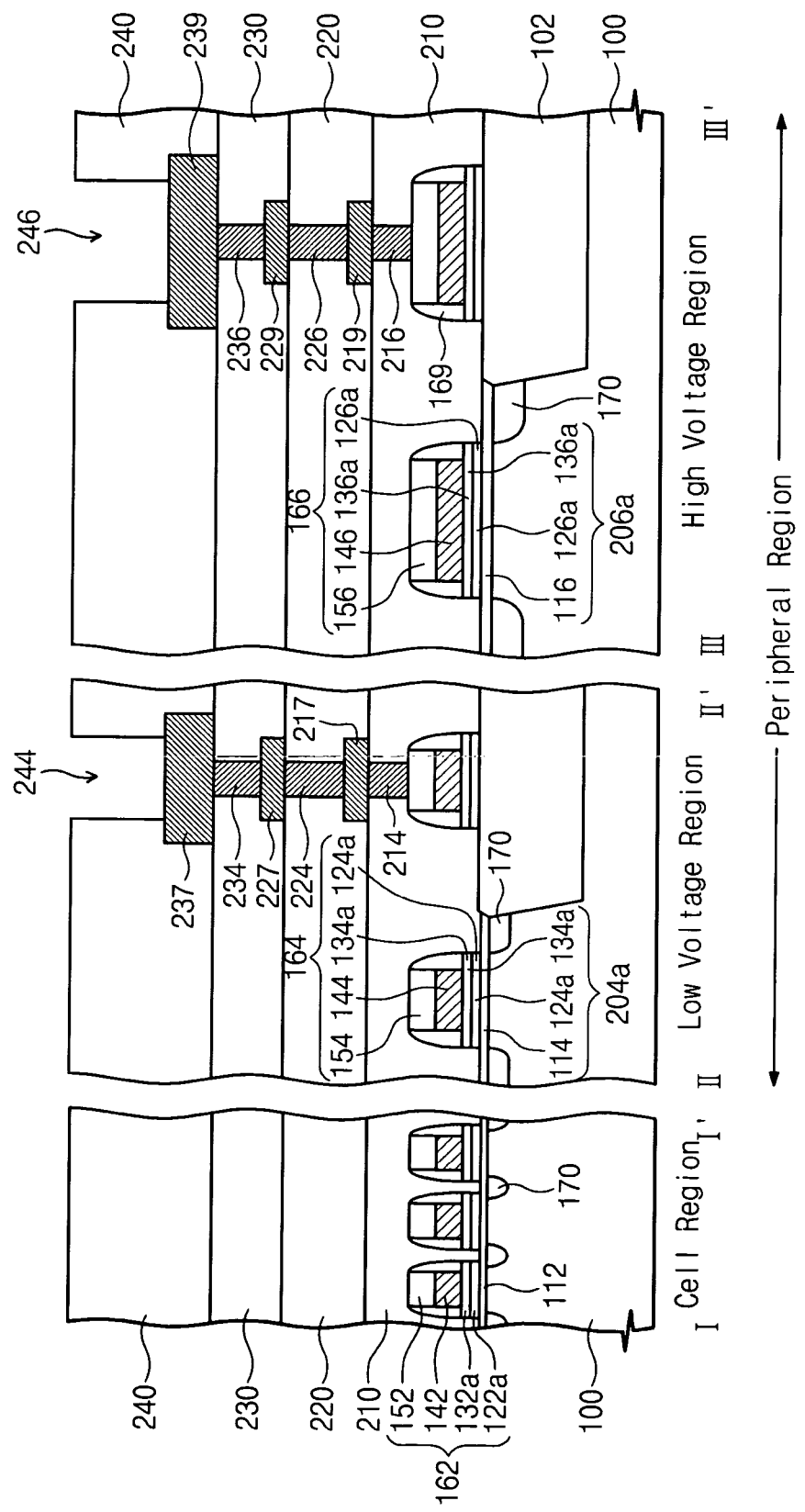

Referring to FIGS. 1 and 3, a semiconductor device according to example embodiments will be described. An overlapping description for the above-mentioned contents will be omitted for conciseness. A cell gate stack 162 including a second cell insulation pattern 122a on the first cell insulation layer 112, a third cell insulation pattern 132a, and a cell gate pattern 142 may be disposed on the cell region. The first cell insulation layer 112 may extend on the semiconductor substrate 100 of the cell region. The second cell insulation pattern 122a, the third cell insulation pattern 132a, and the cell gate pattern 142 may be aligned to the same sidewall. The cell gate stack 162 may further include a first mask layer 152 on the cell gate pattern 142. The first cell insulation layer 112 may be a gate insulation layer, the second cell insulation pattern 122a may be a charge storage layer, and the third cell insulation pattern 132a may be a blocking insulation layer.

In the low voltage region, a first low voltage insulation layer 114 may extend on the semiconductor substrate 100. A low voltage gate stack 164 including a second low voltage insulation pattern 124a, a third low voltage insulation pattern 134a, and a low voltage gate pattern 144 may be disposed on the first low voltage insulation layer 114. The second low voltage insulation pattern 124a, the third low voltage insulation pattern 134a, and the low voltage gate pattern 144 may be aligned to the same sidewall, e.g., the sidewall of the low voltage gate stack 164. The low voltage gate stack 164 may further include a second mask layer 154 on the low voltage gate pattern 144. The first low voltage insulation layer 114, the second low voltage insulation pattern 124a, and the third low voltage insulation pattern 134a may be a low voltage gate insulation layer 204a.

In the high voltage region, the first high voltage insulation layer 116 may extend on the semiconductor substrate 100. A high voltage gate stack 166 including a second high voltage insulation pattern 126a, a third high voltage insulation pattern 136a, and a high voltage gate pattern 146 may be disposed on the first high voltage insulation layer 116. The second high voltage insulation pattern 126a, the third high voltage insulation pattern 136a, and the high voltage gate pattern 146 may be aligned to the same sidewall, e.g., the sidewall of the high voltage gate stack 166. The high voltage gate stack 166 may further include a third mask layer 156 on the high voltage gate pattern 146. The first high voltage insulation layer 116, the second high voltage insulation pattern 126a, and the third high voltage insulation pattern 136a may be a high voltage gate insulation layer 206a. The second high voltage insulation pattern 126a and the second low voltage insulation pattern 124a may be a second peripheral insulation pattern, and the third high voltage insulation pattern 136a and the third low voltage insulation pattern 134a may be a third peripheral insulation pattern.

Additionally, the gate stacks 162, 164, 166 may further include a spacer 169 on their sidewalls respectively. For example, the spacer 169 may include an MTO layer. The first cell insulation layer 112, the first low voltage insulation layer 114, and the first high voltage insulation layer 116 may include the same material. The second cell insulation pattern 122a and the second peripheral insulation patterns 124a, 126a may include the same material, for example, silicon nitride or nanocrystal. The third cell insulation layer 132a and the third peripheral insulation patterns 134a and 136a may include the same material and also include a high-k dielectric material, for example, at least one of silicon oxide ($Si_xO_y$), aluminum oxide ($Al_xO_y$), tantalum oxide ($Ta_xO_y$), hafnium oxide ($HfO_2$), hafnium aluminum oxide (HfAlO), and hafnium silicon oxide (HfSiO).

Referring to FIGS. 1 and 4, a semiconductor device according to example embodiments will be described. An overlapping description for the above-mentioned contents will be omitted for conciseness. In the cell region, a plurality of cell gate patterns 142 being separated from each other may be disposed on a sequentially-stacked first cell insulation layer 112, a second cell insulation layer 122, and third cell insulation layer 132. A first mask layer 152 may be disposed on the cell gate pattern 142. The third cell insulation layer 132, the second cell insulation layer 122, and the first cell insulation layer 112 may extend on a semiconductor substrate 100. The first cell insulation layer 112 may be a gate insulation layer, the second cell insulation layer 122 may be a charge storage layer, and the third insulation layer 132 may be a blocking insulation layer.

In the low voltage region, the first low voltage insulation layer 114 may extend on the semiconductor substrate 100. A low voltage gate stack 164 including the second low voltage insulation pattern 124a, the third low voltage insulation pattern 134a, and the low voltage gate pattern 144 may be disposed on the first low voltage insulation layer 114. The second low voltage insulation pattern 124a, the third low voltage insulation pattern 134a, and the low voltage gate pattern 144 may be aligned to the sidewall of the low voltage gate stack 164. The low voltage gate stack 164 may further include the second mask layer 154 on the low voltage gate pattern 144. The first low voltage insulation layer 114, the second low voltage insulation pattern 124a, and the third low voltage insulation pattern 134a may be a low voltage gate insulation layer 204a.

In the high voltage region, the high voltage insulation layer 116 may extend on the semiconductor substrate 100. A high voltage gate stack 166 including the second high voltage insulation pattern 126a, the third high voltage insulation pattern 136a, and the high voltage gate pattern 146 may be disposed on the first high voltage insulation layer 116. The second high voltage insulation pattern 126a, the third high voltage insulation pattern 136a, and the high voltage gate pattern 146 may be aligned to the sidewall of the high voltage gate stack 166. The high voltage gate stack 166 may further include a third mask layer 156 on the high voltage gate pattern 146. The first high voltage insulation layer 116, the second high voltage insulation pattern 126a, and the third high voltage insulation pattern 136a may be a high voltage gate insulation layer 206a.

The gate stacks 162, 164, 166 may further include a spacer 169 on their sidewalls. For example, the spacer 169 may include an MTO layer. The first cell insulation layer 112, the first low voltage insulation layer 114, and the first high voltage insulation layer 116 may include the same material. The second cell insulation pattern 122 and the second peripheral insulation patterns 124a and 126a may include the same material, for example, silicon nitride or nanocrystal. The third cell insulation layer 132 and the third peripheral insulation patterns 134a and 136a may include the same material and also include a high-k dielectric material, for example, at least one of silicon oxide ($Si_xO_y$), aluminum oxide ($Al_xO_y$), tantalum oxide ($Ta_xO_y$), hafnium oxide ($HfO_2$), hafnium aluminum oxide (HfAlO), and hafnium silicon oxide (HfSiO).

Figure 5B:
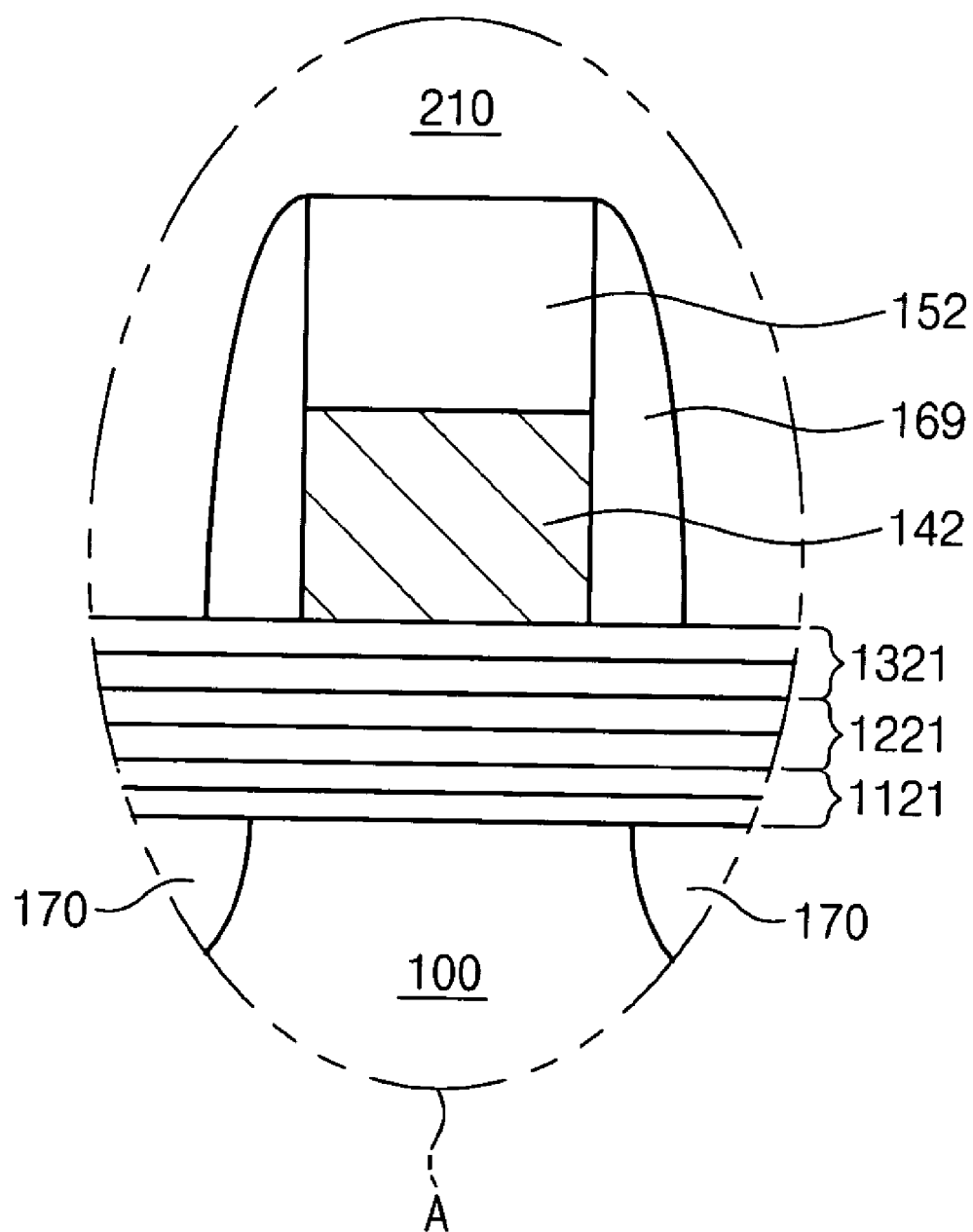
FIG. 5B is an enlarged view of a portion A of FIG. 5A.

Referring to FIGS. 5A and 5B, a semiconductor device including a multilayered insulation layer according to example embodiments will be described. An overlapping description for the above-mentioned contents will be omitted for conciseness. A first cell insulation layer 1121 may include a plurality of layers. For example, the first cell insulation layer 1121 may include a silicon oxide layer ($SiO_2$) and a silicon oxide nitride layer (SiON). The first cell insulation layer 1121 may have a structure in which the silicon oxide layer and the silicon oxide nitride are alternately stacked. The stacking order and the number may be diversely adjusted. A second cell insulation layer 1221 or a second cell insulation pattern 1221a may include a plurality of layers. The second cell insulation layer 1221 or the second cell insulation pattern 1221a may include a silicon nitride layer and a layer including nanocrystal.

A third cell insulation layer 1321 or a third cell insulation pattern 1321a may include a plurality of layers. For example, the third cell insulation layer 1321 or the third cell insulation pattern 1321a may include any one of a silicon oxide ($Si_xO_y$) layer, an aluminum oxide ($Al_xO_y$) layer, a tantalum oxide ($Ta_xO_y$) layer, a hafnium oxide ($HfO_2$) layer, a hafnium aluminum oxide (HfAlO) layer, and a hafnium silicon oxide (HfSiO) layer. A dielectric constant of the third cell insulation layer 1321 or the third cell insulation pattern 1321a may be greater than that of the first cell insulation layer 1121. The gate patterns 142, 144, 146 may include materials having a work function of at least 4 eV.

For example, to reduce tunneling probability of charges through the third cell insulation layer 1321 or the third cell insulation pattern 1321a, a region of the gate patterns 142, 144, 146 contacting the third cell insulation layer 1321 or the third cell insulation pattern 1321a may include Ti, TiN, TaN, TaTi, TaSiN, Ta, W, Hf, HfN, Nb, Mo, $RuO_2$, RuO, $Mo_2N$, WN, WSi, NiSi, $Ti_3Al$, $Ti_2AlN$, Pd, Ir, Pt, Co, Cr, CoSi, NiSi or AlSi. Second peripheral insulation layers 1241, 1261 and third peripheral insulation layers 1341, 1361 may have the same structure as the second cell insulation layer 1221 and the third cell insulation layer 1321. Related U.S. Patent Application Publication No. US-2006-0180851, U.S. Pat. No. 6,858,906, and U.S. Pat. No. 7,253,467 by the same applicant are hereby incorporated by reference in their entirety.

Figure 6:
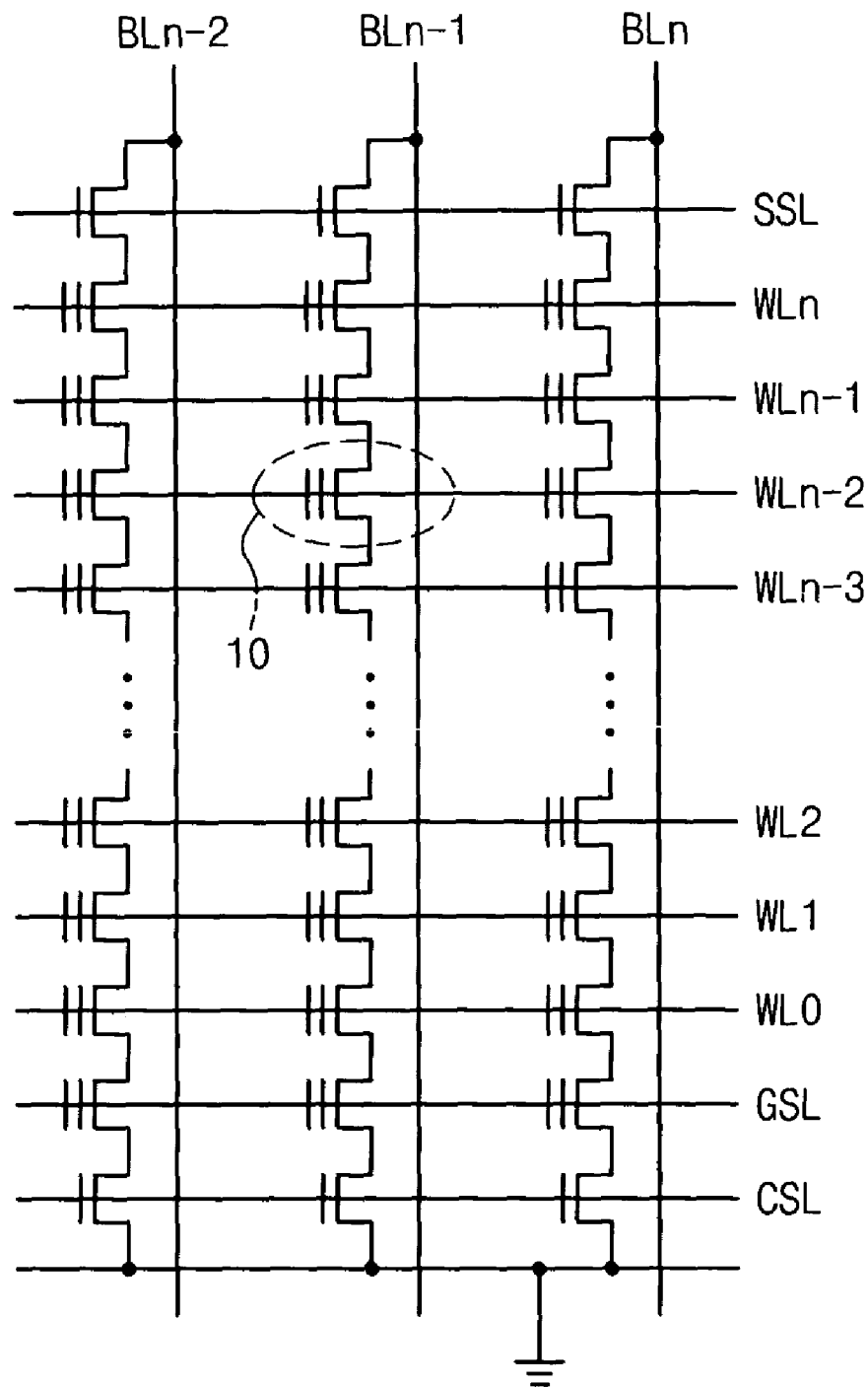

Hereinafter, referring to FIG. 6, a method of operating a semiconductor device according to example embodiments will be described. For example, if a program operation is about to be performed on a specific memory cell 10 of a semiconductor device, a program voltage $V_{pgm}$ (e.g., about 18 V) may be applied to a selected word line WLn-2, and a pass voltage $V_{pass}$ (e.g., about 5 V) may be applied to unselected word lines. About 0 V may be applied to a bulk (e.g., a well region) where memory cells are formed. To program the memory cell 10, a ground voltage (about 0 V) may be applied to a selected bit line. On the other hand, a power supply voltage Vcc may be applied to an unselected bit line to inhibit the program. The power supply voltage Vcc may be applied to a string selection line SSL, about 0 V may be applied to a ground selection line GSL, and about 1.2 V may be applied to a common source line CSL.

During an erase operation, an erase voltage $V_{erase}$ (e.g., about 19 V) may be applied to a bulk (e.g., a well region) where memory cells are formed. A 0 V may be applied to the selected word line WLn-2 and unselected word lines may float. Selection lines, a common source line, and bit lines may float. To confirm the programming or erasing of the specific memory cell 10, a read operation may be performed. During the read operation, a read voltage $V_{read}$ (about 4.5 V) may be applied to unselected word lines, and about 0 V may be applied to the selected word line WLn-2. For example, about 0.9 V may be applied to a selected bit line BLn-1 and about 0.4 V may be applied to unselected bit lines. A read voltage $V_{read}$ may be applied to the string selection line SSL and the ground selection line GSL, and about 0 V may be applied to the common source line CSL and a bulk (e.g., a well region).

Figure 7:
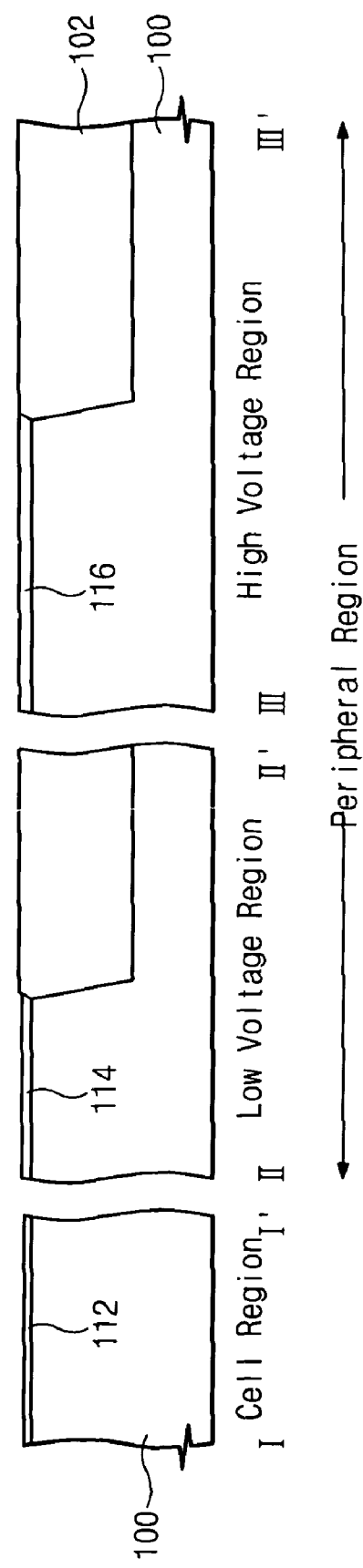

Referring to FIGS. 7 through 15, a method of manufacturing semiconductor device according to example embodiments will be described. Referring to FIG. 7, a semiconductor substrate 100 may be provided. The semiconductor substrate 100 includes a cell region and a peripheral region. The peripheral region includes a low voltage region and a high voltage region. Active regions of the cell region and the peripheral region may be defined by forming a device isolation region 102 in the semiconductor substrate 100. For example, the device isolation region 102 may be formed through a shallow trench isolation (STI) method.

A first cell insulation layer 112 and first peripheral insulation layer may be formed on the cell region and the peripheral region. The first peripheral insulation layer may include a first low voltage insulation layer 114 and a first high voltage insulation layer 116 in a low voltage region and a high voltage region, respectively. The first high voltage insulation layer 116 may be formed thicker than the first low voltage insulation layer 114 in order to endure a higher voltage. The first low voltage insulation layer 114 may have the same thickness as or be thicker than the first cell insulation layer 112.

For example, a first oxide mask pattern (not shown) exposing the high voltage region may be provided in order to form the first high voltage insulation layer 116. A thermal oxidation process may be performed on the exposed high voltage region to form the first high voltage insulation layer 116. After the first oxide mask pattern is removed, a second oxide mask pattern (not shown) covering the cell region may be formed. By using the second oxide mask pattern, the first low voltage insulation layer 114 may be formed on the low voltage region through a thermal oxidation process, and the first high voltage insulation layer 116 may become thicker. After removing the second oxide mask pattern, a first cell insulation layer 112 may be formed on the cell region through a thermal oxidation process, and the first low voltage insulation layer 114 and the first high voltage insulation layer 116 may become thicker. It will be appreciated, however, that the order of forming the insulation layers 112, 114, 116 may vary. The first cell insulation layer 112 may be formed of a single layer or a multilayer. For example, the first cell insulation layer 112 may include silicon oxide and/or silicon oxide nitride.

Figure 8:
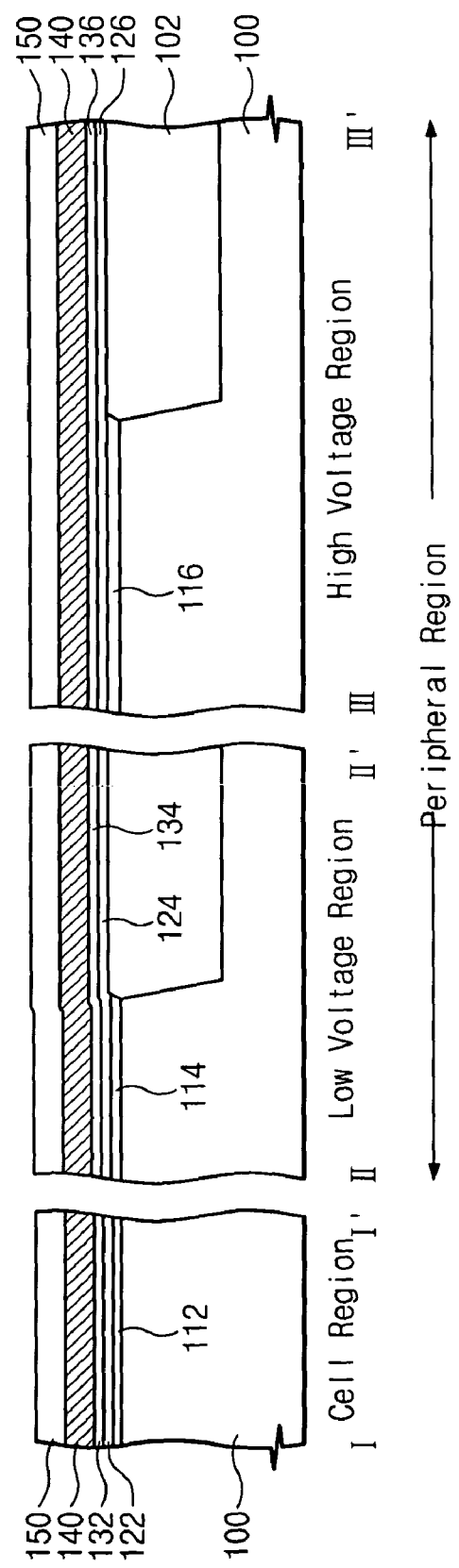

Referring to FIG. 8, a second cell insulation layer 122 may be formed on the first cell insulation layer 112. A second low voltage insulation layer 124 and a third high voltage insulation layer 126 may be formed on the first low voltage insulation layer 114 and the first high voltage insulation layer 116, respectively. The second low voltage insulation layer 124 and the second high voltage insulation layer 126 may be a second peripheral insulation layer. The second cell insulation layer 122 and the second peripheral insulation layer 124, 126 may be formed simultaneously through a chemical vapor deposition (CVD) method, for example. The second cell insulation layer 122 and the second peripheral insulation layers 124 and 126 may include silicon nitride or nanocrystal. The second cell insulation layer 122 may be formed of a single layer or a multilayer.

A third cell insulation layer 132 and a third peripheral insulation layer may be formed on the second cell insulation layer 122 and the second peripheral insulation layer 124, 126, respectively. The third peripheral insulation layer includes a third low voltage insulation layer 134 and a third high voltage insulation layer 136. The third cell insulation layer 132 and the third peripheral insulation layer 134, 136 may be simultaneously formed through the same process, and may include an oxide. The third cell insulation layer 132 and the third peripheral insulation layer 134, 136 may include a high-k dielectric material, for example, at least one of silicon oxide ($Si_xO_y$), aluminum oxide ($Al_xO_y$), tantalum oxide ($Ta_xO_y$), hafnium oxide ($HfO_2$), hafnium aluminum oxide (HfAlO), and hafnium silicon oxide (HfSiO). The third cell insulation layer 132 may be formed of a single layer or a multilayer.

A first conductive layer 140 may be formed on the third cell insulation layer 132 and the third peripheral insulation layer 134, 136. The first conductive layer 140 may include a metal material, for example, at least one of tantalum nitride (TaN), tantalum (Ta), tungsten (W), tungsten nitride (WN), titanium (Ti), titanium nitride (TiN), and titanium aluminum nitride (TiAlN). The first conductive layer 140 may include TaTi, TaSiN, Hf, HfN, Nb, Mo, $RuO_2$, RuO, $Mo_2N$, WSi, NiSi, $Ti_3Al$, Pd, Ir, Pt, Co, Cr, CoSi, NiSi or AlSi. A mask layer 150 may be formed on the first conductive layer 140. The mask layer 150 may include an oxide.

Figure 9:
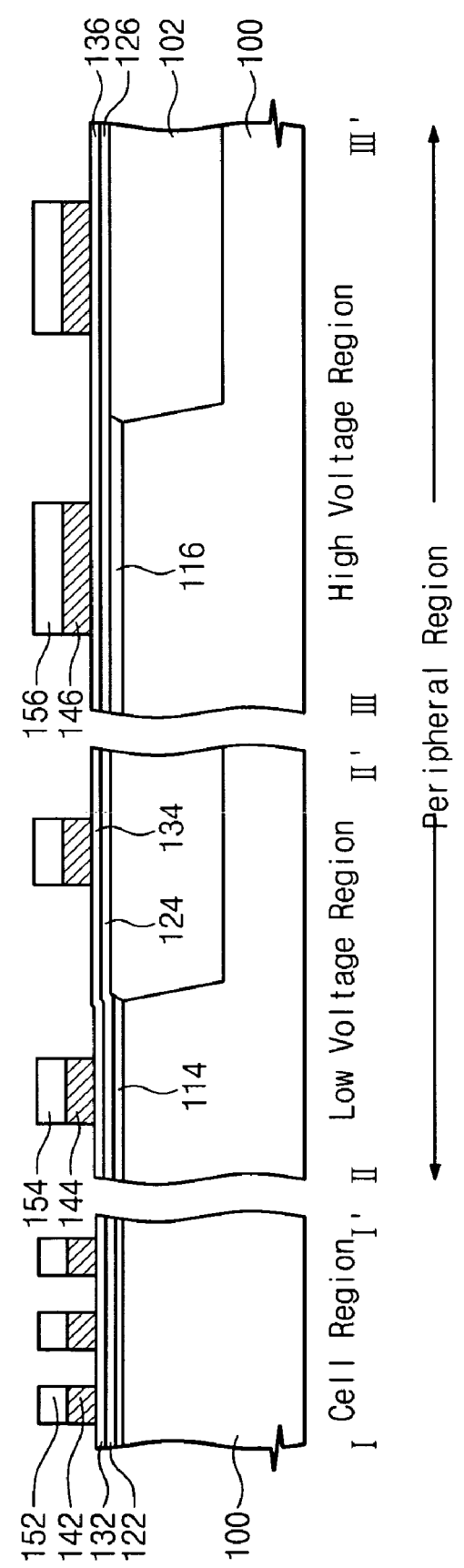

Referring to FIG. 9, a patterning process may be performed on the mask layer 150 and the first conductive layer 140. For example, the patterning process may be performed using a photolithography process. An etching mask (not shown) may be formed on the mask layer 150 by a photolithography process. In order to expose the third cell insulation layer 132 and the third peripheral insulation layer 134, 136, the mask layer 150 and the first conductive layer 140 exposed by the etching mask may be sequentially etched. Therefore, a cell gate pattern 142 and a first mask layer 152 may be sequentially stacked in the cell region, a low voltage gate pattern 144 and a second mask layer 154 may be sequentially stacked in the low voltage region, and a high voltage gate pattern 146 and a third mask layer 156 may be sequentially stacked in the high voltage region. The patterning process may be performed to expose the first cell insulation layer 132 and the first peripheral insulation layer.

Figure 10:
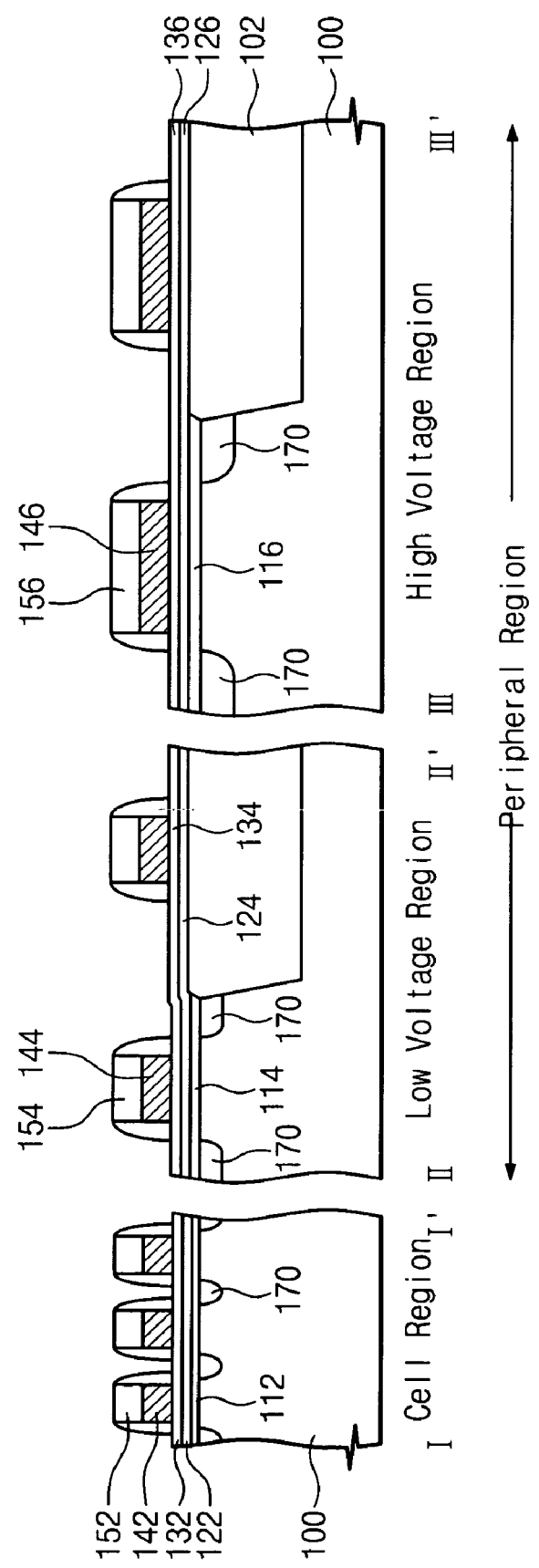
Figure 11:
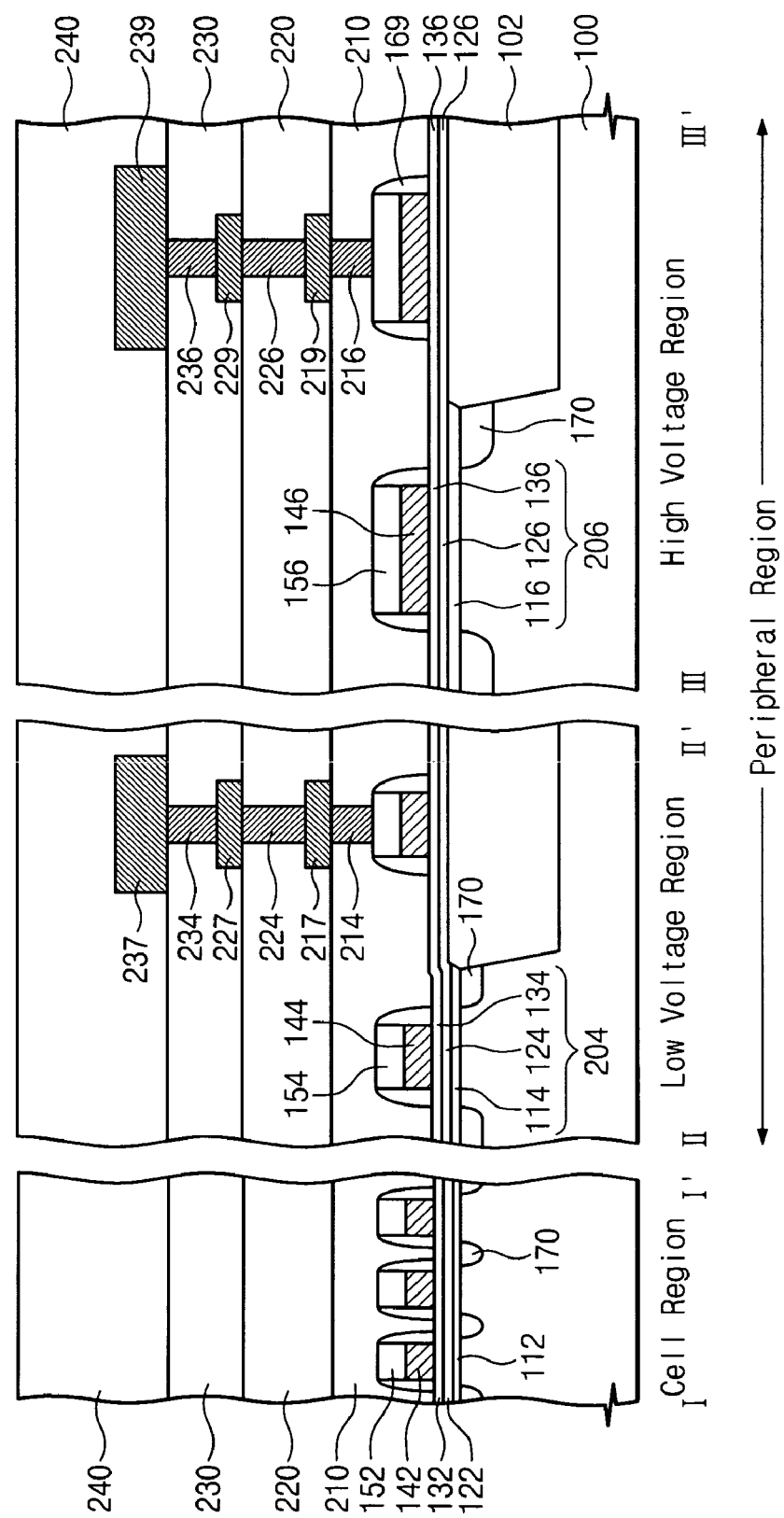

Referring to FIG. 10, a spacer 169 of FIG. 11 may be further formed on the respective sidewalls of the stacked gate patterns 142, 144, 146 and the mask layers 152, 154, 156. The spacer 169 may include an MTO layer. An impurity region 170 may be formed by performing an impurity implantation process on active regions of the semiconductor substrate 100 exposed by the gate patterns 142, 144, 146. The impurity implantation process may be performed several times through an ion implantation process, for example. The gate patterns 142, 144, 146 may be covered by the mask layers 152, 154, 156 such that they are protected during the impurity implantation process.

Referring to FIG. 11, a first interlayer insulation layer 210 may be formed on the resultant structure having the gate patterns 142, 144, 146. Contact holes exposing the top surfaces of the low voltage gate pattern 144 and the high voltage gate pattern 146 may be formed in the first interlayer insulation layer 210. By filling the contact holes with a conductive material, a first contact 214 may be formed to be electrically connected to the low voltage gate pattern 144, and a second contact 216 may be formed to be electrically connected to the high voltage gate pattern 146. The first contact 214 and the second contact 216 may be formed by performing a conductive layer formation process and a planarization process.

For example, the conductive layer may include polysilicon with impurities, tungsten, titanium or/and copper. Although not illustrated in the drawings, contacts (electrically connected to the impurity regions 170) may be further formed in the first interlayer insulation layer 210. A first pad 217 and a second pad 219 may be formed on the first contact 214 and the second contact 216. The first pad 217 and the second pad 219 include a conductive material. The conductive material may include the same material as or a different material from the contact. The contact 214 and 216 and the pads 217 and 219 may be simultaneously formed through a damascene process.

A second interlayer insulation layer 220 may be formed on the pads 217 and 219 and the first interlayer insulation layer 210. A third contact 224 and a fourth contact 226 may be formed in the second interlayer insulation layer 220 in order to be electrically connected to the first pod 217 and the second pad 219, respectively. The third contact 224 and the fourth contact 226 may be formed through the same method as the first contact 214 and the second contact 216. A third pad 227 and a fourth pad 229 may be formed on the third contact 224 and the fourth contact 226, respectively. The third pad 227 and the fourth pad 229 may be formed through the same method as the first pad 217 and the second pad 219. Although not illustrated in the drawings, an interconnection (not shown), e.g., a bit line, may be formed on the second interlayer insulation layer 220.

A third interlayer insulation layer 230 may be formed on the second interlayer insulation layer 220. A fifth contact 234 and a sixth contact 236 may be formed in the third interlayer insulation layer 230 to be electrically connected to the third pad 227 and the fourth pad 229, respectively. The fifth contact 234 and the sixth contact 236 may be formed through the same method as the third contact 224 and the fourth contact 226. A first bonding pad 237 and a second bonding pad 239 may be formed on the fifth contact 234 and the sixth contact 236, respectively. The bonding pads 237 and 239 may be formed through the same method as other bonding pads may be formed, but may be formed with a thicker thickness.

Figure 12:
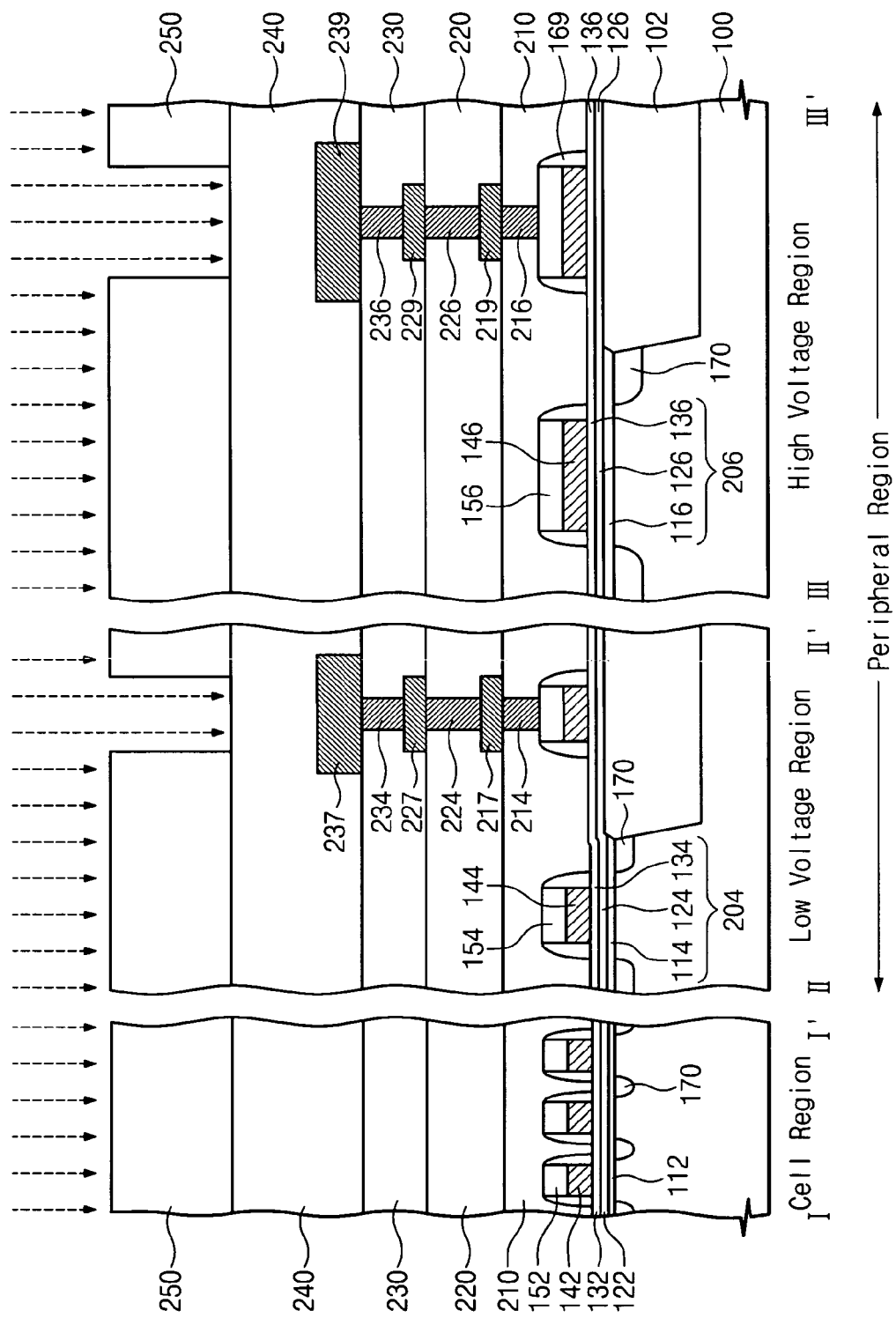
Figure 13:
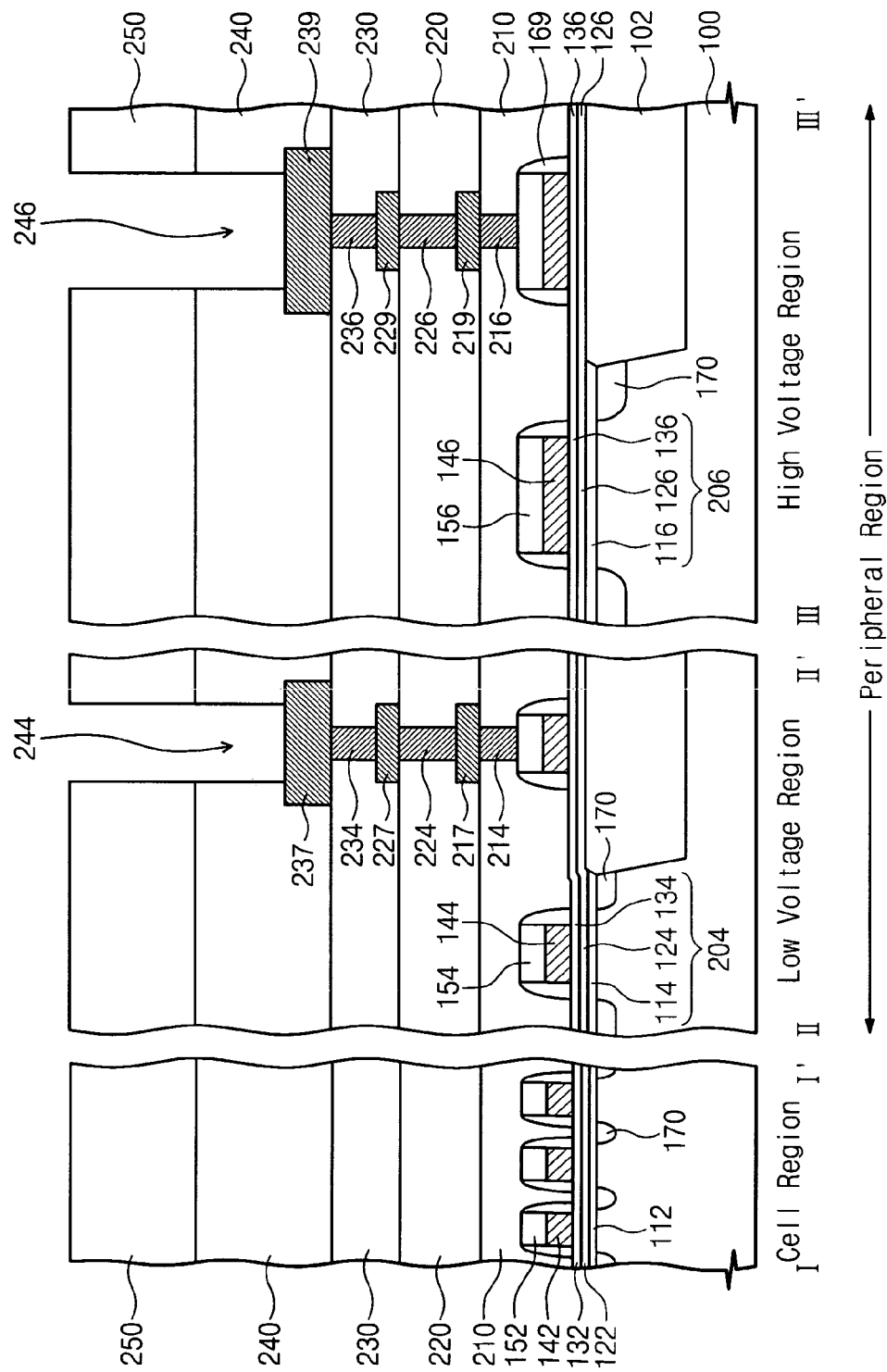

A passivation layer 240 may be formed on the resultant structure having the bonding pads 237 and 239. The passivation layer 240 may include at least one of a silicon oxide layer, a silicon nitride layer, and a polyimide layer. Referring to FIGS. 12 and 13, a first pad opening 244 and a second pad opening 246 may be formed to expose the top surfaces of the first bonding pad 237 and the second bonding pad 239, respectively, by patterning the passivation layer 240.

In order to form the pad openings 244 and 246, after forming a photoresist pattern 250 on the passivation layer 240 through a photolithography process, the passivation layer 240 may be etched by using the photoresist pattern 250 as an etching mask. The passivation layer 240 may be etched through an anisotropic etching process. The anisotropic etching process may be a plasma etching process. If power for performing the plasma etching process is below about 1000 W, the passivation layer 240 may not be etched or take a relatively long time for performing the plasma etching process. If power for performing the plasma etching process is greater than about 1500 W, electron charges may be charged into the second peripheral insulation layer 124, 126 of the peripheral area. Accordingly, the power for performing the plasma etching process may range from about 1000 W to about 1500 W.

The anisotropic etching process may be performed with a higher etching selectivity of the passivation layer 240 to the bonding pads 237 and 239. The photoresist pattern 250 may be removed. Thereafter, an external interconnection (not shown) may be formed to be electrically connected to the exposed bonding pads 237 and 239.

According to a result, the first cell insulation layer 112 may be a gate insulation layer, the second cell insulation layer 122 may be a charge storage layer, and the third cell insulation layer 132 may be a blocking layer. The first low voltage insulation layer 114, the second low voltage insulation layer 124, and the third low voltage insulation layer 134 may constitute a low voltage gate insulation layer 204. The first high voltage insulation layer 116, the second high voltage insulation layer 126, and the third high voltage insulation layer 136 may constitute a high voltage gate insulation layer 206. A silicon oxide layer may be used as the above mentioned interlayer insulation layer.

Figure 14:
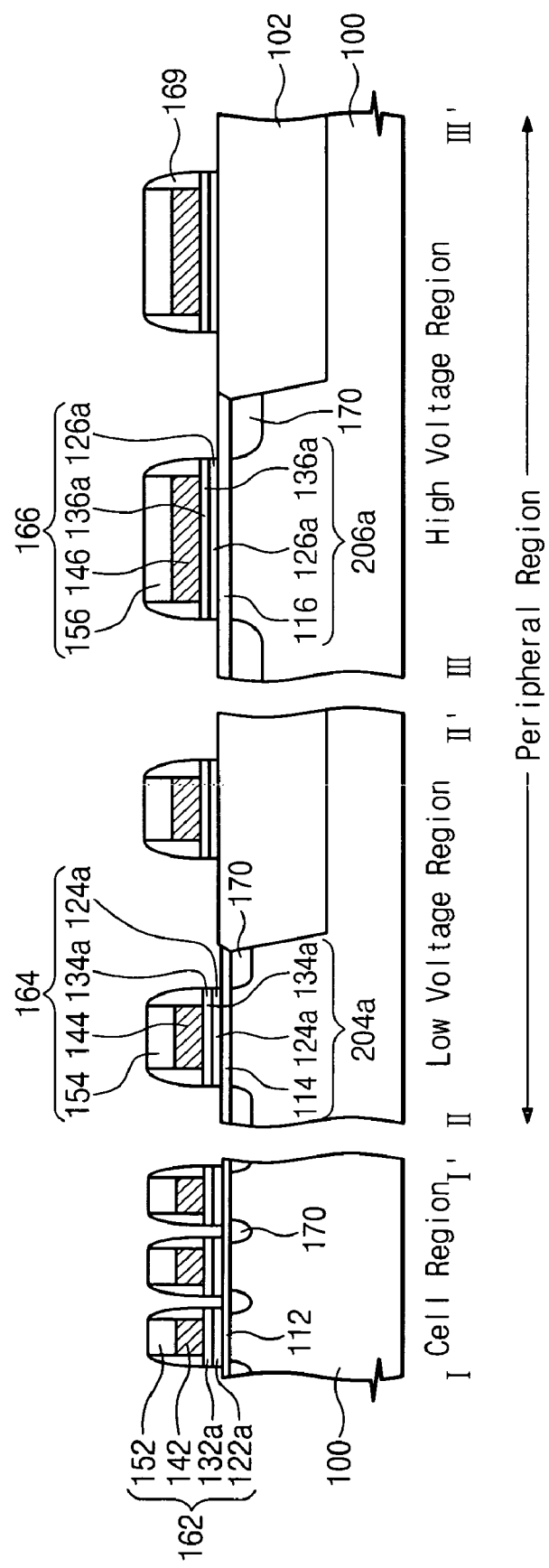

Hereinafter, a method of manufacturing a semiconductor device according to example embodiments will be described with reference to FIG. 14. An overlapping description for the above-mentioned contents will be omitted for conciseness. An etching process may be further performed on the resultant structure of FIG. 10. The etching process may be performed using the spacer 169 and the mask layers 152, 154, 156 as an etching mask. For example, the etching process may be performed to expose the first cell insulation layer 112 and the first peripheral insulation layer 114, 116. The etching process may be simultaneously performed on the cell area and the peripheral area. A second cell insulation pattern 122a, a third cell insulation pattern 132a, a second low voltage insulation pattern 124a, a third low voltage insulation pattern 134a, a second high voltage insulation pattern 126a, and a third high voltage insulation pattern 136a may be formed through the etching process.

The first cell insulation layer 112 may be a gate insulation layer, the second cell insulation pattern 122a may be a charge storage layer, and the third cell insulation pattern 132a may be a blocking insulation layer. The first low voltage insulation layer 114, the second low voltage insulation pattern 124a, and the third low voltage insulation pattern 134a of the low voltage region may be a low voltage gate insulation layer 204a. The first high voltage insulation layer 116, the second high voltage insulation pattern 126a, and the third high voltage insulation pattern 136a may be a high voltage gate insulation layer 206a. The second cell insulation pattern 122a and the third cell insulation pattern 132a may be aligned to the sidewalls of the cell gate stack 162. The second low voltage insulation pattern 124a and the third low voltage insulation pattern 134a may be aligned to the sidewalls of the low voltage gate stack 164. The second high voltage insulation pattern 126a and the third high voltage insulation pattern 136a may be aligned to the sidewalls of the high voltage gate stack 166. An interconnection formation process may be performed on the result as illustrated above.

Figure 15:
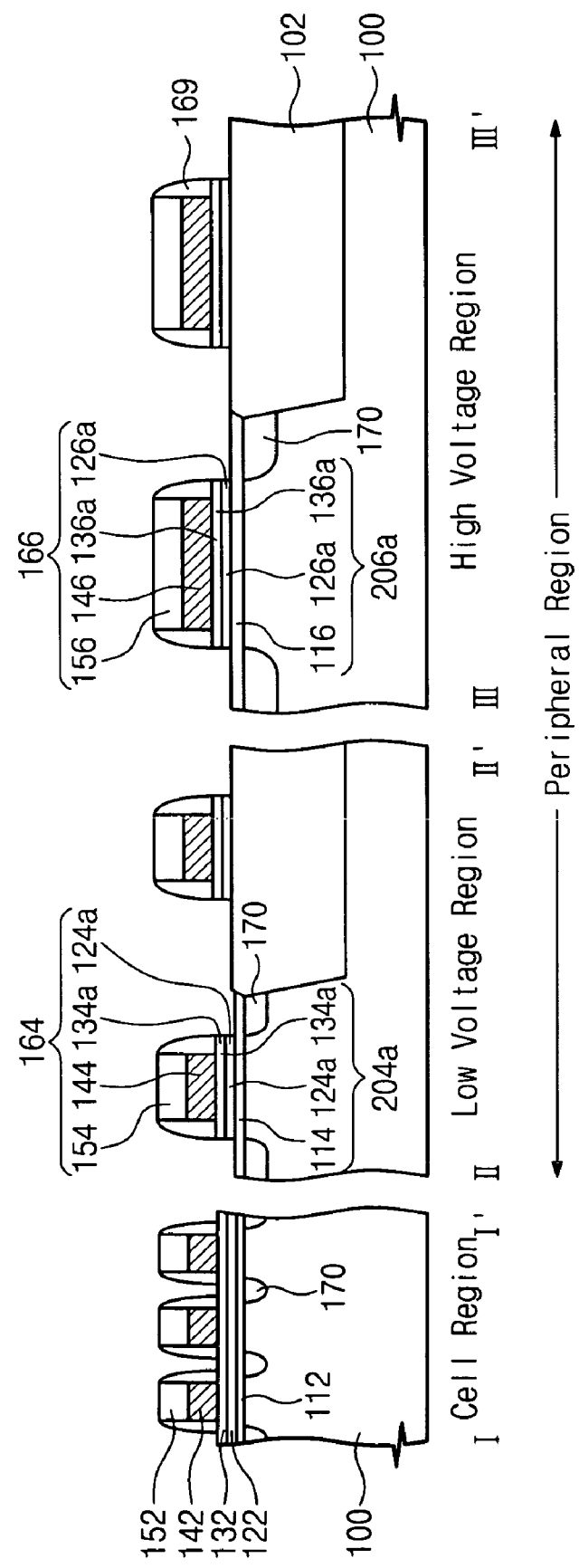

Referring to FIG. 15, a method of manufacturing a semiconductor device according to example embodiments will be described. An overlapping description for the above-mentioned contents will be omitted for conciseness. An etching process may be further performed on the result of FIG. 10. The etching process may be performed to expose the first low voltage insulation layer 114 and the first high voltage insulation layer 116 of the peripheral region. Therefore, a second low voltage insulation pattern 124a, a third low voltage insulation pattern 134a, a second high voltage insulation pattern 126a, and a third high voltage insulation pattern 136a may be formed.

For example, to perform the above etching process, a mask pattern (not shown) may be formed. The mask pattern may cover the cell area, and may expose the peripheral region. By using the mask pattern, the cell region may be protected, and also by using the spacer and the mask layers 154, 156 of the peripheral region, the third peripheral insulation layers 134, 136 and the second peripheral insulation layers 124, 126 may be etched. The second low voltage insulation pattern 124a and the third low voltage insulation pattern 134a may be aligned to the sidewalls of the low voltage gate stack 164. The second high voltage insulation pattern 126a and the third high voltage insulation pattern 136a may be aligned to the sidewalls of the high voltage gate stack 166. An interconnection formation process may be performed on the result as described above.

Figure 16:
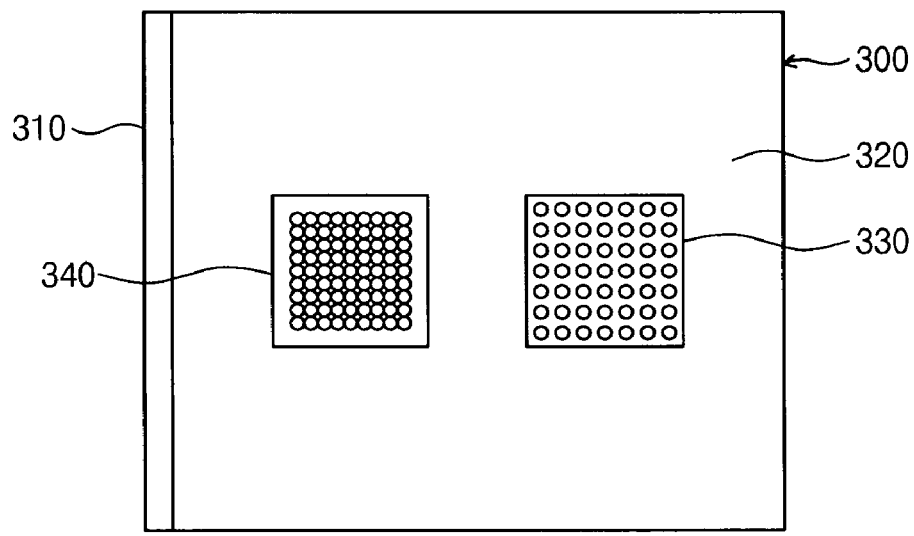

Referring to FIG. 16, a modular memory device including a semiconductor device according to example embodiments will be described. The modular memory device 300 may include a printed circuit board 320. The printed circuit board 320 may form one of the external surfaces of the modular memory device 300. The printed circuit board 320 may support a memory unit 330, a device interface unit 340, and an electrical connector 310.

The memory unit 330 may include a three-dimensional memory array and may be connected to a memory array controller. The memory array may include the appropriate number of memory cells arranged in a three-dimensional lattice on the printed circuit board 320. The device interface unit 340 may be formed on a separated substrate such that the device interface unit 340 may be electrically connected to the memory unit 330 and the electrical connector 310 through the printed circuit board 320. Additionally, the memory unit 330 and the device interface unit 340 may be directly mounted on the printed circuit board 320. The device interface unit 340 may include components necessary for generating voltages, clock frequencies, and protocol logic.

Figure 17:
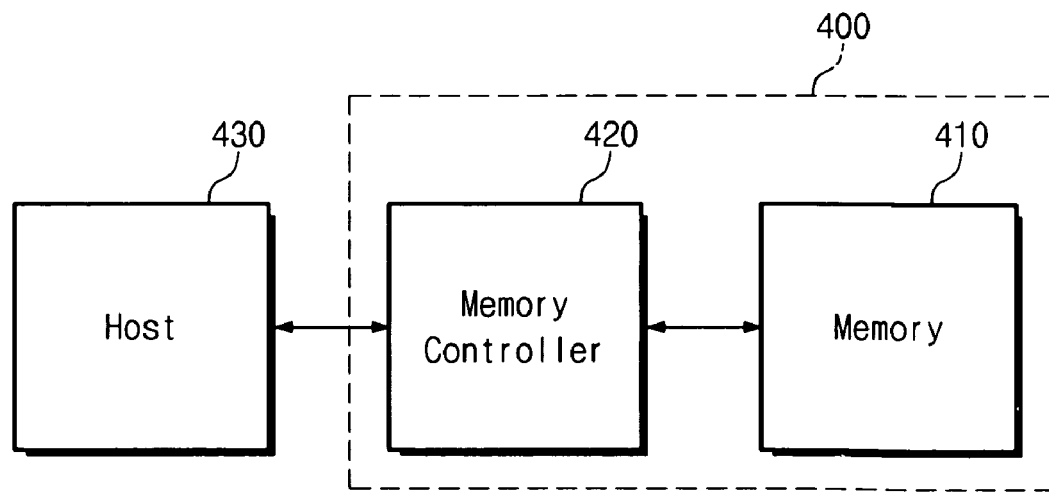

Referring to FIG. 17, a memory system including a semiconductor device according to example embodiments will be described. A memory system 400 includes a memory 410 for storing a relatively large amount of data and a memory controller 420. The memory controller 420 controls the memory device 410 in order to read or write data from/into the memory 410 in response to a read/write request of a host 430. The memory controller 420 may include an address mapping table for mapping an address provided from the host 430 (e.g., mobile devices or computer systems) into a physical address of the memory device 410.

Figure 18:
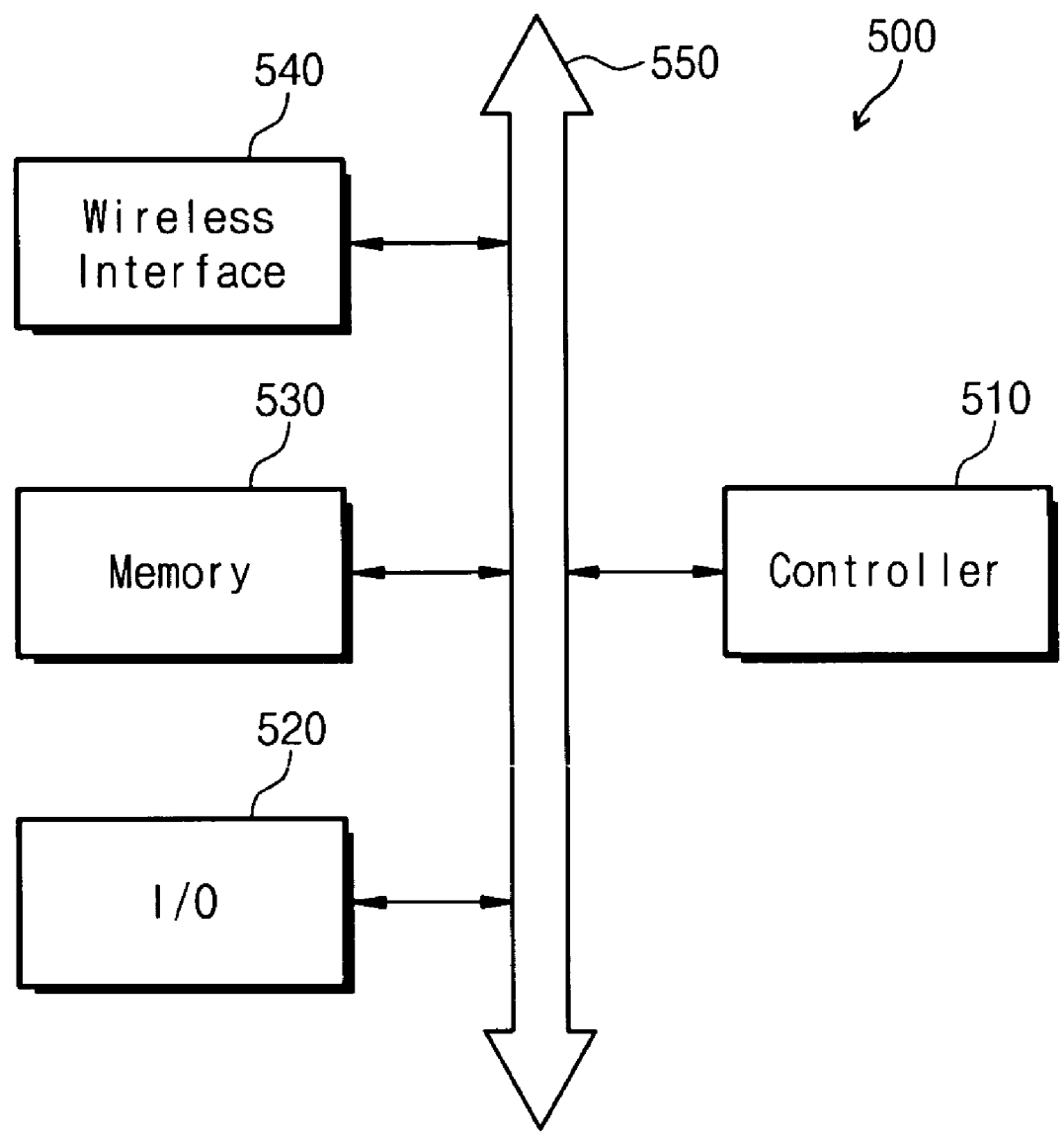

Referring to FIG. 18, an electron device including a semiconductor device according to example embodiments will be described. The electron device 500 may be used in a wireless communication device (e.g., a personal digital assistant, a laptop computer, a portable computer, a web tablet, a wireless telephone, a mobile phone and/or a wireless digital music player.) or in all devices capable of transmitting and/or receiving information via wireless environments.

The electron device 500 includes a controller 510, an input/output (I/O) device 520 (e.g., a keypad, a keyboard, and a display), a memory 530, and a wireless interface 540. The controller 510 may include at least one of a microprocessor, a digital signal processor and a similar process. The memory 530 may be used to store commands executed by the controller 510, for example. The memory 530 may be used to store user data. The memory 530 includes a semiconductor device according to example embodiments. The electron device 500 may utilize the wireless interface 540 in order to transmit/receive data via a wireless communication network. For example, the wireless interface 540 may include an antenna and/or a wireless transceiver.

The electron device 500 according to example embodiments may be used in a communication interface protocol of the third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000. According to example embodiments, gates of a peripheral region may be formed during the forming of gates of a cell region. Accordingly, manufacturing processes of a semiconductor device may be simplified.

The above-disclosed subject matter may be considered illustrative, and not restrictive, and the appended claims are intended to cover all such modifications, enhancements, and other embodiments, which fall within the true spirit and scope of example embodiments. Thus, to the maximum extent allowed by law, the scope of example embodiments may be determined by the broadest permissible interpretation of the following claims and their equivalents, and shall not be restricted or limited by the foregoing detailed description.

What is claimed is:

1. A semiconductor device comprising:
   a substrate including a cell region and a peripheral region;
   a cell gate pattern on the cell region; and
   a peripheral gate pattern on the peripheral region,
   wherein a first cell insulation layer, a second cell insulation layer, and a third cell insulation layer are between the substrate and the cell gate pattern,
   a first peripheral insulation layer, a second peripheral insulation layer, and a third peripheral insulation layer are between the substrate and the peripheral gate pattern, and
   the second cell insulation layer and the third cell insulation layer include a same material as the second peripheral insulation layer and the third peripheral insulation layer,
   wherein a thickness of the first cell insulation layer is different from a thickness of the first peripheral insulation layer.

2. The semiconductor device of claim 1, wherein the peripheral region includes a high voltage region and a low voltage region, and the first peripheral insulation layer includes a first high voltage insulation layer on the high voltage region and a first low voltage insulation layer on the low voltage region, and
   wherein the first high voltage insulation layer is thicker than the first low voltage insulation layer, and the first low voltage insulation layer is thicker than the first cell insulation layer.

3. The semiconductor device of claim 1, wherein the second cell insulation layer includes silicon nitride or nanocrystal.

4. The semiconductor device of claim 1, wherein the second cell insulation layer has a same thickness as the second peripheral insulation layer, and the third cell insulation layer has a same thickness as the third peripheral insulation layer.

5. The semiconductor device of claim 1, wherein the third cell insulation layer includes at least one of silicon oxide ($Si_xO_y$), aluminum oxide ($Al_xO_y$), tantalum oxide ($Ta_xO_y$), hafnium oxide ($HfO_2$), hafnium aluminum oxide (HfAlO), and hafnium silicon oxide (HfSiO).

6. The semiconductor device of claim 1, wherein the cell gate pattern and the peripheral gate pattern include a same conductive material.

7. The semiconductor device of claim 1, further comprising:
   a cell mask pattern and a peripheral mask pattern on the cell gate pattern and the peripheral gate pattern, respectively;
   spacers on sidewalls of the cell gate pattern and the peripheral gate pattern; and
   impurity regions in the substrate at least adjacent to the sidewalls of the cell gate pattern and the peripheral gate pattern.

8. The semiconductor device of claim 1, further comprising:
   a contact electrically connected to the peripheral gate pattern;
   a bonding pad electrically connected to the contact; and
   a capping insulation layer exposing the bonding pad.

9. The semiconductor device of claim 1, wherein the second cell insulation layer, the third cell insulation layer, the second peripheral insulation layer, and the third peripheral insulation layer extend on the semiconductor substrate.

10. The semiconductor device of claim 1, wherein the second cell insulation layer and the third cell insulation layer extend onto the semiconductor substrate, and the second peripheral insulation layer and the third peripheral insulation layer are aligned to a same sidewall with the peripheral gate pattern.

11. The semiconductor device of claim 1, wherein the second cell insulation layer and the third cell insulation layer are aligned to a same sidewall with the cell gate pattern, and the second peripheral insulation layer and the third peripheral insulation layer are aligned to a same sidewall with the peripheral gate pattern.

12. The semiconductor device of claim 1, wherein at least one of the first cell insulation layer, the second cell insulation layer, and the third cell insulation layer includes a plurality of layers.

13. A method of manufacturing a semiconductor device, the method comprising:
forming a first peripheral insulation layer on a peripheral region of a substrate;
forming a first cell insulation layer on a cell region of the substrate;
simultaneously forming a second cell insulation layer on the first cell insulation layer and a second peripheral insulation layer on the first peripheral insulation layer;
simultaneously forming a third cell insulation layer on the second cell insulation layer and a third peripheral insulation layer on the second peripheral insulation layer; and
forming a cell gate pattern on the third cell insulation layer and a peripheral gate pattern on the third peripheral insulation layer,
wherein a thickness of the first cell insulation layer is different from a thickness of the first peripheral insulation layer.

14. The method of claim 13, wherein the peripheral region includes a high voltage region and a low voltage region, and the first peripheral insulation layer includes a first high voltage insulation layer on the high voltage region and a first low voltage insulation layer on the low voltage region, and
wherein the first high voltage insulation layer is thicker than the first low voltage insulation layer, and the first low voltage insulation layer is thicker than the first cell insulation layer.

15. The method of claim 13, wherein forming the cell gate pattern and the peripheral gate pattern comprises:
forming a conductive layer on the third cell insulation layer and the third peripheral insulation layer;
forming an etching mask on the conductive layer; and
etching the conductive layer to expose the third cell insulation layer on the cell region and the third peripheral insulation layer on the peripheral region by using the etching mask.

16. The method of claim 15, further comprising:
removing the etching mask;
forming a cell mask to cover the cell region; and
etching the third peripheral insulation layer and the second peripheral insulation layer to expose the first peripheral insulation layer of the peripheral region by using the cell mask.

17. The method of claim 15, further comprising:
etching the third cell insulation layer, the third peripheral insulation layer, the second cell insulation layer, and the second peripheral insulation layer to expose the first cell insulation layer and the first peripheral insulation layer by using the etching mask.

18. The method of claim 13, further comprising:
forming a mask layer on a top surface of the gate patterns;
forming spacers on sidewalls of the gate patterns; and
forming impurity regions in the substrate below the sidewalls of the gate patterns.

19. The method of claim 13, further comprising:
forming a contact electrically connected to the peripheral gate pattern;
forming a bonding pad electrically connected to the contact;
forming a capping insulation layer on a resultant structure having the bonding pad; and
plasma etching the capping insulation layer to expose a top surface of the bonding pad,
wherein a power for the plasma etching ranges from about 1000 W to about 1500 W.

20. The method of claim 13, wherein at least one of the first cell insulation layer, the second cell insulation layer, and the third cell insulation layer includes a plurality of layers.

21. A semiconductor device comprising:
a substrate including a cell region and a peripheral region;
a cell gate pattern on the cell region; and
a peripheral gate pattern on the peripheral region,
wherein a first cell insulation layer, a second cell insulation layer, and a third cell insulation layer are between the substrate and the cell gate pattern,
a first peripheral insulation layer, a second peripheral insulation layer, and a third peripheral insulation layer are between the substrate and the peripheral gate pattern, and
the second cell insulation layer and the third cell insulation layer include a same material as the second peripheral insulation layer and the third peripheral insulation layer,
wherein the peripheral region includes a high voltage region and a low voltage region, and the first peripheral insulation layer includes a first high voltage insulation layer on the high voltage region and a first low voltage insulation layer on the low voltage region, and
wherein a thickness of the first cell insulation layer is different from a thickness of the first high voltage insulation layer.

* * * * *